United States Patent
Yamaguchi et al.

(10) Patent No.: US 10,629,448 B2
(45) Date of Patent: Apr. 21, 2020

(54) METHOD OF MANUFACTURING SEMICONDUCTOR DEVICE AND VACUUM PROCESSING APPARATUS

(71) Applicant: TOKYO ELECTRON LIMITED, Tokyo (JP)

(72) Inventors: Tatsuya Yamaguchi, Yamanashi (JP); Reiji Niino, Yamanashi (JP); Hiroyuki Hashimoto, Yamanashi (JP); Syuji Nozawa, Yamanashi (JP); Makoto Fujikawa, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 31 days.

(21) Appl. No.: 15/919,671

(22) Filed: Mar. 13, 2018

(65) Prior Publication Data
US 2018/0269069 A1    Sep. 20, 2018

(30) Foreign Application Priority Data

Mar. 15, 2017    (JP) .................................. 2017-050181

(51) Int. Cl.
| | |
|---|---|
| *H01L 21/00* | (2006.01) |
| *H01L 21/308* | (2006.01) |
| *H01L 21/311* | (2006.01) |
| *H01L 21/266* | (2006.01) |
| *H01L 21/027* | (2006.01) |
| *H01L 21/02* | (2006.01) |

(Continued)

(52) U.S. Cl.
CPC ...... *H01L 21/3081* (2013.01); *H01L 21/0271* (2013.01); *H01L 21/02118* (2013.01); *H01L 21/02318* (2013.01); *H01L 21/0332* (2013.01); *H01L 21/0465* (2013.01); *H01L 21/266* (2013.01); *H01L 21/3086* (2013.01); *H01L 21/31144* (2013.01)

(58) Field of Classification Search
CPC .................. H01L 21/0465; H01L 21/3081
See application file for complete search history.

(56) References Cited

U.S. PATENT DOCUMENTS

| | | | | |
|---|---|---|---|---|
| 5,097,010 A | * | 3/1992 | Markle | ............... C08G 18/2815 525/195 |
| 5,470,945 A | * | 11/1995 | Markle | ............... C08G 18/2815 525/195 |

(Continued)

FOREIGN PATENT DOCUMENTS

| | | | | |
|---|---|---|---|---|
| CN | 108630530 A | * | 10/2018 | ......... H01L 21/0332 |
| JP | 2018156982 A | * | 10/2018 | ........ H01L 21/31144 |
| KR | 20180105579 A | * | 9/2018 | ............ H01L 21/266 |

*Primary Examiner* — Laura M Menz
(74) *Attorney, Agent, or Firm* — Nath, Goldberg & Meyer; Jerald L. Meyer

(57) ABSTRACT

A method for manufacturing a semiconductor device by processing a substrate, the method includes forming a first film of a polymer having urea bonds by supplying a polymerization raw material to a surface of the substrate, subsequently, forming a pattern by etching the first film, and subsequently, forming a second film of a material different from the polymer of the first film by performing a substitution processing to the first film by supplying a reaction gas, which reacts with the polymerization raw material to generate a product, to the substrate while heating the substrate to depolymerize the polymer.

6 Claims, 46 Drawing Sheets

(51) Int. Cl.
*H01L 21/04* (2006.01)
*H01L 21/033* (2006.01)

(56) References Cited

U.S. PATENT DOCUMENTS

| | | | | |
|---|---|---|---|---|
| 5,851,261 | A * | 12/1998 | Markusch | C05G 3/0029 |
| | | | | 71/64.07 |
| 6,277,750 | B1 * | 8/2001 | Pawlowski | G03F 7/091 |
| | | | | 438/689 |
| 6,329,117 | B1 * | 12/2001 | Padmanaban | G03F 7/091 |
| | | | | 430/270.1 |
| 6,803,168 | B1 * | 10/2004 | Padmanaban | C08F 220/34 |
| | | | | 430/270.1 |
| 8,252,113 | B2 * | 8/2012 | Hatanaka | B05D 1/60 |
| | | | | 118/715 |
| 9,414,445 | B2 | 8/2016 | Ahmad et al. | |
| 9,805,943 | B2 * | 10/2017 | Kikuchi | G03F 7/094 |
| 9,910,354 | B2 * | 3/2018 | Sakaida | G03F 7/11 |
| 10,241,412 | B2 * | 3/2019 | Nagai | H01L 21/31133 |
| 10,338,469 | B2 * | 7/2019 | Asano | G03F 7/039 |
| 2005/0227482 | A1 * | 10/2005 | Korzenski | C11D 3/042 |
| | | | | 438/639 |
| 2009/0238968 | A1 * | 9/2009 | Hatanaka | B05D 1/60 |
| | | | | 427/237 |
| 2016/0284559 | A1 * | 9/2016 | Kikuchi | G03F 7/094 |
| 2017/0017153 | A1 * | 1/2017 | Asano | B41C 1/1008 |
| 2017/0045820 | A1 * | 2/2017 | Sakaida | G03F 7/11 |
| 2018/0261458 | A1 * | 9/2018 | Yamaguchi | H01L 21/26513 |
| 2018/0269069 | A1 * | 9/2018 | Yamaguchi | H01L 21/3081 |
| 2018/0284614 | A1 * | 10/2018 | Satoh | G03F 7/11 |
| 2018/0284615 | A1 * | 10/2018 | Nagai | H01L 21/31133 |
| 2018/0286744 | A1 * | 10/2018 | Yamaguchi | H01L 21/76811 |
| 2019/0041753 | A1 * | 2/2019 | Tachibana | H01L 21/0332 |
| 2019/0122883 | A1 * | 4/2019 | Yamaguchi | H01L 21/3105 |

* cited by examiner

X=H, Cl, Br, N(CH3)2

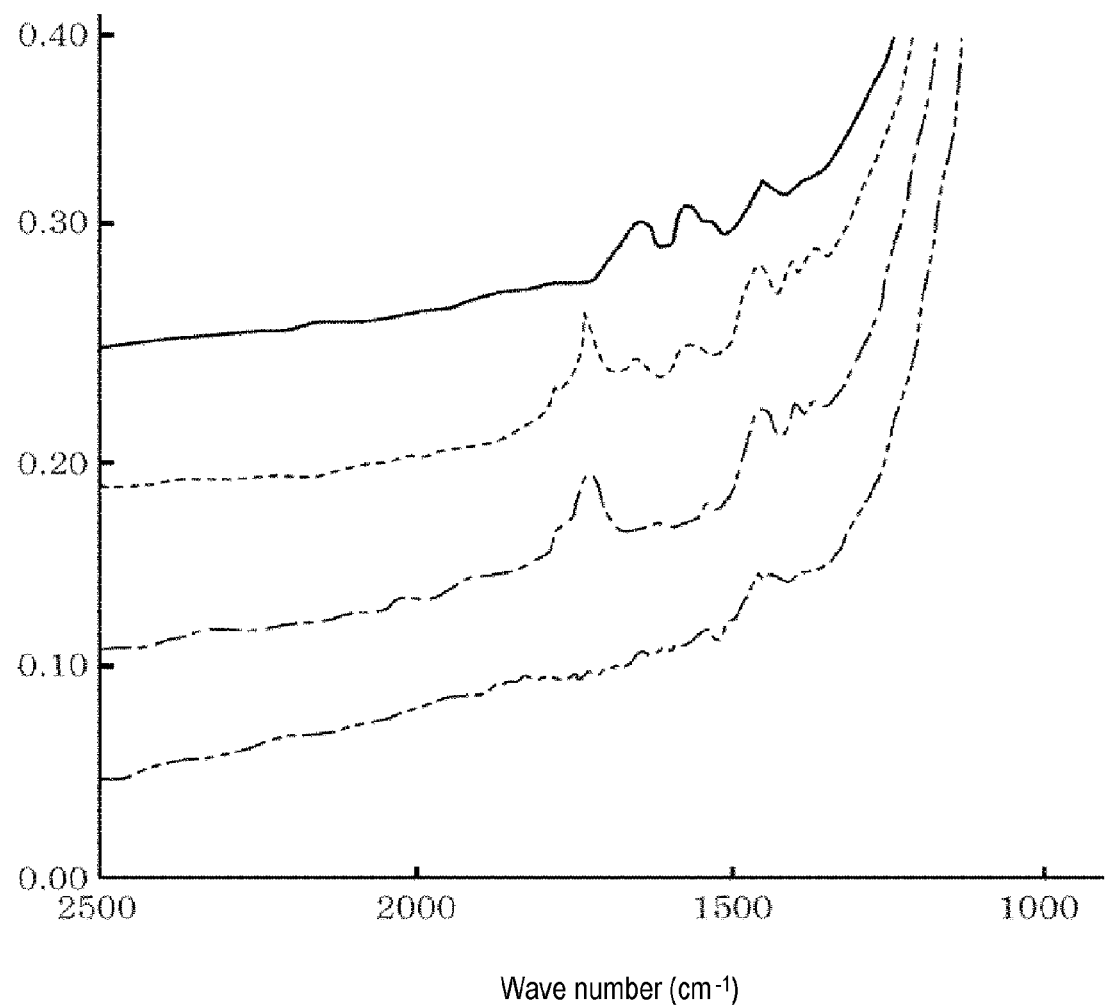

US 10,629,448 B2

METHOD OF MANUFACTURING SEMICONDUCTOR DEVICE AND VACUUM PROCESSING APPARATUS

CROSS-REFERENCE TO RELATED APPLICATION

This application claims the benefit of Japanese Patent Application No. 2017-050181, filed on Mar. 15, 2017, in the Japan Patent Office, the disclosure of which is incorporated herein in its entirety by reference.

TECHNICAL FIELD

The present disclosure relates to a technique for forming a film on a substrate for manufacturing a semiconductor device.

BACKGROUND

In the manufacturing process of a semiconductor device, various films are formed on a semiconductor wafer (hereinafter, referred to as a wafer), which is a substrate. One of these films may be used as a mask for processing a lower layer film thereof. Since a specific example will be given in the detailed description of the invention, it will be briefly described here. In some cases, it is required to form a film of a specific material in order for the film to function as a mask. However, since the wafer tends to warp due to the characteristics of the film, it is difficult to perform fine processing on the film, thereby hindering the micronization of the wiring.

The prior art discloses a technique in which PMMA (acrylic resin) is previously filled in the hole of a porous low-permittivity film on the substrate, a process such as an etching processing is performed with respect to the low-permittivity film, the substrate is heated, a solvent is supplied, and the PMMA is removed by radiating microwaves thereto. However, this technique cannot solve the above problem.

SUMMARY

The present disclosure has been made in such a background, and provides a technique that enables the micronization of a semiconductor device by forming a fine pattern on a film formed on a substrate.

According to one embodiment of the present disclosure, there is provided a method for manufacturing a semiconductor device by processing a substrate, the method includes forming a first film of a polymer having urea bonds by supplying a polymerization raw material to a surface of the substrate, subsequently, forming a pattern by etching the first film, and subsequently, forming a second film of a material different from the polymer of the first film by performing a substitution processing to the first film by supplying a reaction gas, which reacts with the polymerization raw material to generate a product, to the substrate while heating the substrate to depolymerize the polymer.

According to another embodiment of the present disclosure, there is provided a vacuum processing apparatus includes an etching processing module configured to etch, in a vacuum atmosphere, a substrate including, on a surface of the substrate, a first film made of a polymer having urea bonds and a resist film formed on the first film to have a resist pattern so as to form a pattern corresponding to the resist pattern on the first film; and a substitution module configured to heat the substrate so as to depolymerize the polymer, and configured to supply a reaction gas, which reacts with a polymerization raw material to generate a product, to the substrate so as to form a second film of a material different from the polymer of the first film by performing a substitution processing to the first film.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 28 is a graph showing results of evaluation tests.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Figure 1A:
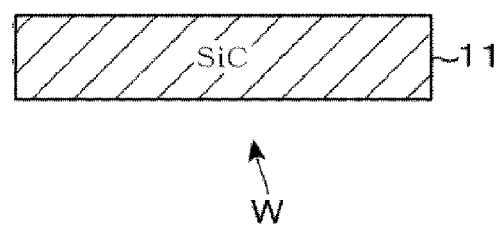
FIGS. 1A to 1C are explanatory diagrams showing some of the processes of a method of manufacturing a semiconductor device, according to an embodiment of the present disclosure.

A first embodiment of a method of manufacturing a semiconductor device according to the present disclosure will be described with reference to FIGS. 1A to 4J. The manufacturing method of the first embodiment, for example, may be applied to respective processes in which ion implantation is performed in the manufacturing process of a metal-oxide-semiconductor field-effect transistor (MOSFET), which is a semiconductor device. FIG. 1A shows a SiC (silicon carbide) layer 11 on the surface of a wafer W.

Figure 1B:
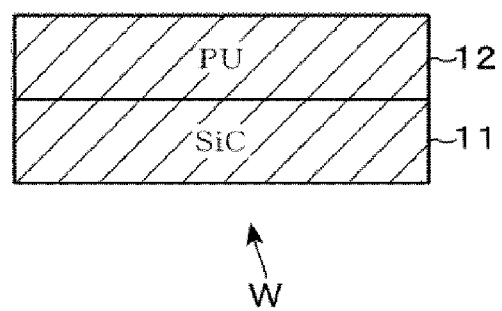
Figure 5:
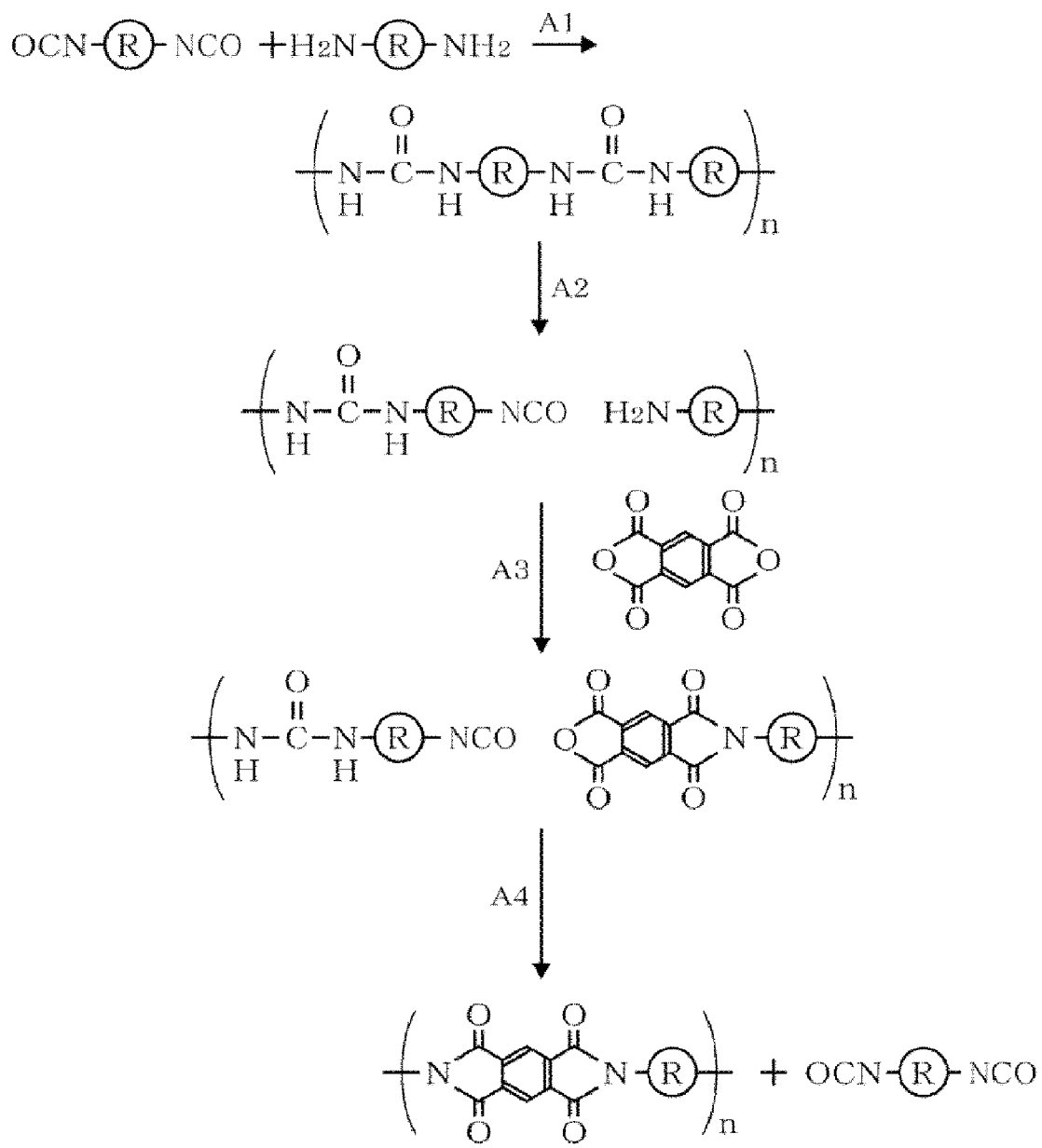
FIG. 5 is an explanatory diagram showing chemical reactions occurring in the processes of the manufacturing method.

First, a polyurea (PU) film 12 is formed so as to be stacked on the SiC layer 11, which is a lower layer film (FIG. 1B). The polyurea film 12 is formed through the chemical reaction shown by the arrow A1 in FIG. 5. More specifically, the polyurea film may be formed by copolymerizing isocyanate and amine, which are raw material monomers, so as to form a urea bond. FIG. 5 shows diisocyanate as an example of the isocyanate and diamine as an example of the amine, respectively. In addition, R in FIG. 5 denotes, for example, an alkyl group (straight chain alkyl group or cyclic alkyl group) or an aryl group and n denotes an integer of 2 or more.

For example, alicyclic compounds, such as 1,3-bis (aminomethyl) cyclohexane (H6XDA), or aliphatic compounds, such as 1,12-diaminododecane (DAD), may be used for the amine of a raw material monomer. For example, alicyclic compounds, aliphatic compounds, or aromatic compounds may be used for the isocyanate of a raw material monomer. The alicyclic compounds may include, for example, 1,3-bis (isocyanatomethyl) cyclohexane (H6XDI), and the aliphatic compounds may include, e.g., hexamethylene diisocyanate. The polyurea film 12, for example, may be formed by supplying a chemical liquid containing the amine and the isocyanate as raw material monomers to a wafer (W) and heating the same.

Figure 1C:
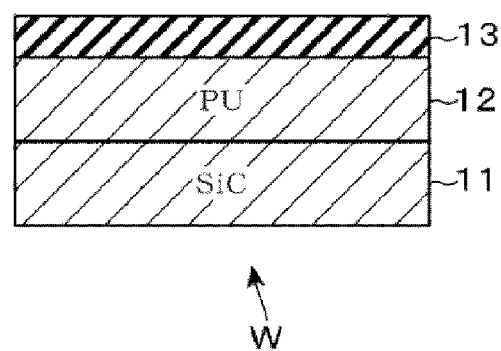

Subsequently, an inorganic film 13 is formed so as to be stacked on the polyurea film 12 (FIG. 1C). The inorganic film 13 is an anti-reflection film containing, for example, Si as a main component and, more specifically, is formed of, for example, a SiOC (carbon-doped silicon oxide) film, a SiN (silicon nitride) film, a polysilicon film, a $SiO_2$ (silicon oxide) film, or the like. The inorganic film 13 may be formed by means of, for example, a CVD (Chemical Vapor Deposition) method, or may be formed by supplying a chemical liquid to the wafer (W) as will be described later.

Figure 2A:
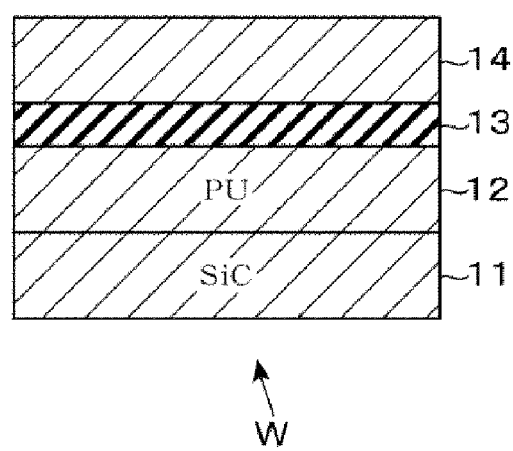
FIGS. 2A to 2C are explanatory diagrams showing some of the processes of a method of manufacturing a semiconductor device, according to an embodiment of the present disclosure.
Figure 2B:
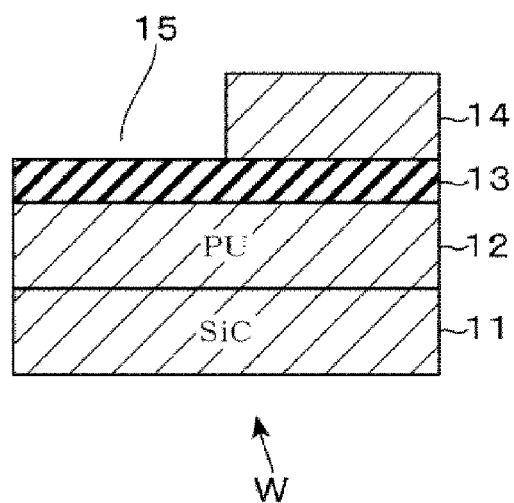
Figure 2C:
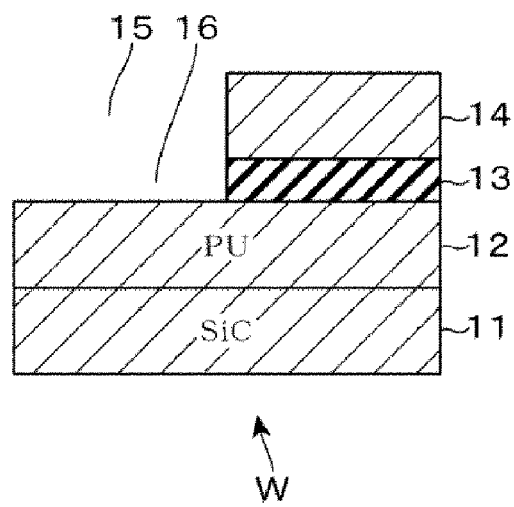

Next, a resist film 14 is formed so as to be stacked on the inorganic film 13 (FIG. 2A). Then, the resist film 14 is exposed and developed, thereby forming an opening 15 constituting a resist pattern as a mask pattern (FIG. 2B). Thereafter, the inorganic film 13 is etched using the resist film 14 as a mask (FIG. 2C), thereby forming an opening 16 constituting a mask pattern in the inorganic film 13. This etching processing may be performed, for example, by supplying an etching gas to the wafer W. For example, in the case where the inorganic film 13 is formed of SiOC or SiN as described above, a CF-based gas, such as $CF_4$ (carbon tetrafluoride), may be used as an etching gas.

Figure 3A:
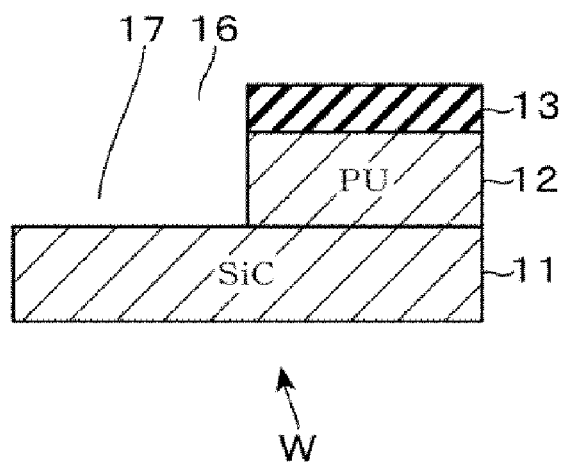
FIGS. 3A to 3C are explanatory diagrams showing some of the processes of a method of manufacturing a semiconductor device, according to an embodiment of the present disclosure.
Figure 3B:
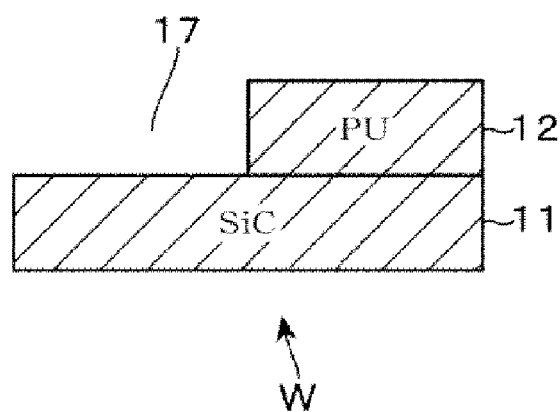

In addition, the polyurea film 12 is etched using the inorganic film 13 as a mask to thus form an opening 17 constituting a mask pattern in the polyurea film 12, and the resist film 14 is removed (FIG. 3A). This etching processing may be performed using, for example, an $O_2$ (oxygen) gas as an etching gas, wherein the $O_2$ gas is converted into plasma. Thereafter, the inorganic film 13 is etched and removed (FIG. 3B). This etching processing may be performed, for example, by supplying an etching gas to the wafer W. In the case where the inorganic film 13 is formed of SiOC or SiN as described above, a CF-based gas may be used as an etching gas.

Figure 3C:
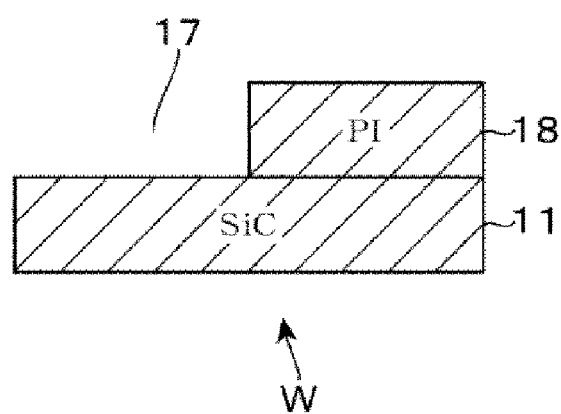

Thereafter, a polyimide (PI) film 18 is formed to substitute for the polyurea film 12 (FIG. 3C). The formation of the polyimide film 18 will be described in detail. When the polyurea constituting the polyurea film 12 is heated to 200 degrees C. or more, the urea bond in the polyurea is cut off so that the polyurea is depolymerized to amine and isocyanate, which are raw material monomers. That is, the chemical reaction indicated by the arrow A2 in FIG. 5 occurs. The heating of the polyurea may be conducted, for example, in a vacuum atmosphere. Along with the heating, a film substitution gas (reaction gas) containing, for example, pyromellitic dianhydride (PMDA), which is a raw material monomer for forming a polyimide film, is supplied to the wafer W, the chemical reaction between the PMDA and the amine generated by the depolymerization of the polyurea film 12 occurs. That is, the chemical reactions indicated by the arrows A3 and A4 in FIG. 5 proceed to thus form the polyimide film 18 as described above. In addition, the isocyanate generated by the depolymerization is vaporized to then be desorbed from the film and is diffused to then be removed.

Figure 6A:
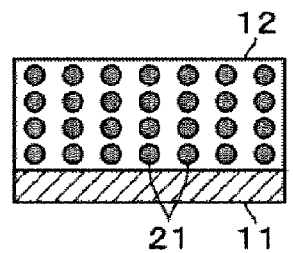
FIGS. 6A to 6D are mimic diagrams showing the state in which a polyurea film is substituted by a polyimide film.
Figure 6B:
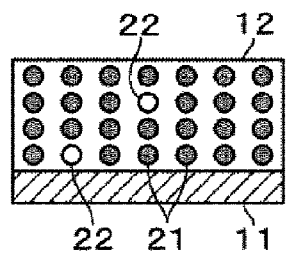
Figure 6C:
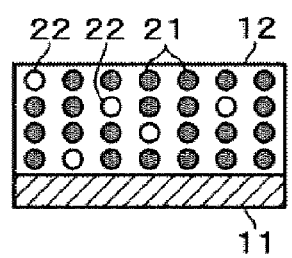
Figure 6D:
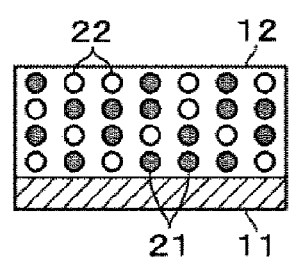

FIGS. 6A to 6D and 7A to 7D are mimic diagrams showing the state in which the polyurea film 12 is substituted by the polyimide film 18. In the drawings, the greyscale circle 21 represents a urea bond in the film, the white circle 22 represents a raw material monomer generated by depolymerization, and the hatched circle 23 represents the produced polyimide. FIG. 6A shows a wafer W before heating. When the temperature of the wafer W is increased to 200 degrees C. by heating the same, depolymerization occurs to thereby generate raw material monomers 22 in the polyurea film 12 (FIG. 6B). In addition, as the temperature is further increased, the raw material monomers 22 in the film are increased (FIG. 6C) and the temperature of the wafer W reaches, for example, 250 degrees C. At this time, only some of the urea bonds 21 are in a cut-off state in the polyurea film 12 (FIG. 6D). More specifically, the polyurea film 12 is in a dynamic equilibrium state, in which the dissociation of the polyurea into the raw material monomers occurs simultaneously with the generation of the polyurea by the formation of the urea bonds from the raw material monomers, so that the raw material monomers 22 are maintained in a constant ratio in the film and the polyurea film 12 is not dissipated.

Figure 7A:
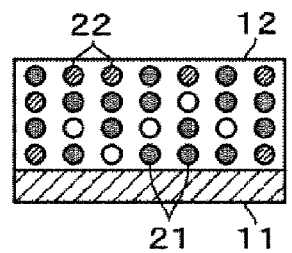
FIGS. 7A to 7D are mimic diagrams showing the state in which a polyurea film is substituted by a polyimide film.
Figure 7B:
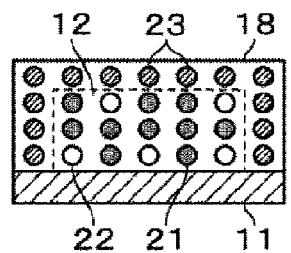
Figure 7C:
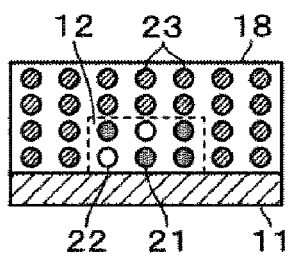
Figure 7D:
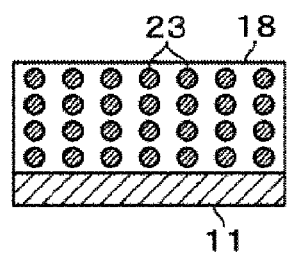

When the film substitution gas is supplied to the wafer W in the dynamic equilibrium state, the gas diffuses from the outside of the polyurea film 12 to the inside thereof, and the raw material monomers 22, which are generated in the surface layer of the polyurea film 12, react with the film substitution gas to produce the polyimide 23 as described in FIG. 5 (FIG. 7A). As the film substitution gas further diffuses into the film of the polyurea film 12 and the reaction between the gas and the raw material monomers 22 continues to occur in the diffusion area, the region substituted by the polyimide 23 spreads from the surface layer of the polyurea film 12 to the inside thereof. That is, the substitution of the polyurea film 12 by the polyimide film 18 proceeds from the surface layer of the polyurea film 12 to the inside thereof (FIGS. 7B and 7C), and finally the whole polyurea film 12 is substituted by the polyimide film 18 (FIG. 7D).

If the temperature of the wafer W is too high during the substitution by the polyimide film 18, the depolymerization of the polyurea film 12 proceeds excessively, so that the polyurea film 12 is dissipated and the formation of the polyimide film 18 cannot be performed. On the other hand, if the temperature of the wafer W is too low, depolymerization does not proceed, and thus the polyimide film 18 may not be formed. Therefore, it is preferred that the wafer W be heated, for example, at 200 degrees C. to 300 degrees C. In addition, since the polyimide film 18 is formed by depolymerizing the polyurea film 12 as described above, respective processes from the formation of the polyurea film 12 in FIG. 1B to the etching of the inorganic film 13 shown in FIG. 3B just prior to forming the polyimide film 18 are conducted at a temperature at which the polyurea film 12 is not dissipated by the depolymerization.

Figure 4:
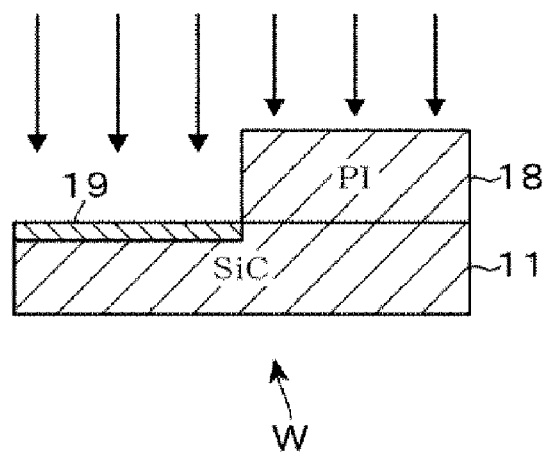
FIG. 4 is an explanatory diagram showing some of the processes of a method of manufacturing a semiconductor device, according to an embodiment of the present disclosure.

After the formation of the polyimide film 18, ion implantation is performed using, for example, $BF_3$ (boron trifluoride) or the like as a dopant and the polyimide film 18 as a mask. In FIG. 4, the region where the ion implantation is performed is indicated by the reference numeral 19. It is effective to use the polyimide film 18 having a heat resistance of 400 degrees C. or more as a mask because the ion implantation for SiC requires a relatively high temperature.

Hereinafter, the reason why the polyurea film 12, as a first film, is substituted to thus form the polyimide film 18, as a second film, in the embodiment of the present disclosure will be described. The polyimide film 18 may also be formed by applying a chemical liquid containing a film forming raw material, such as polyamic acid, to the wafer W and then heating the wafer W to evaporate the solvent in the chemical liquid. Therefore, the polyimide film 18 may be formed on the SiC layer 11 by applying and heating the chemical liquid, instead of forming the polyurea film 12 in FIG. 1B. After the formation of the polyimide film 18, it may be considered to form an inorganic film 13 and a resist film 14 in the same manner as the polyurea film 12 and to transfer a resist pattern formed on the resist film 14 to the polyimide film 18 to then use the same as a mask for ion implantation. However, in such a manufacturing process, when the polyimide film 18 is formed by applying the chemical liquid to the wafer W and heating the same, the polyimide film 18 thermally shrinks to thus apply a relatively large stress to the wafer W, which causes warpage of the wafer W. Thereby, there may be an exposure failure in which the exposed region in the resist film 14 deviates from a predetermined region. As a result, since the patterns formed on the resist film 14 and the polyimide film 18 become misaligned at a specific position, it may be difficult to micronize the patterns formed on the respective films and the regions to be ion-implanted.

However, in the embodiment of the present disclosure, the polyurea film 12 is formed by applying a chemical liquid. Since the formation of the polyurea film 12 brings about little thermal shrinkage and thus the stress applied to the wafer W is small as compared with the case where the polyimide is formed from the chemical liquid as described above, the wafer W hardly warps. In addition, after the pattern formed on the resist film 14 is transferred to the polyurea film 12, the polyurea film 12 is substituted by the polyimide film 18 by means of depolymerization of the polyurea film 12, and the SiC layer 11 is ion-implanted using the polyimide film 18 as a mask. Since the warpage of the wafer W is suppressed, it is possible to form a pattern with high precision at a predetermined position of the resist film 14 and thus to form a pattern with high precision at a predetermined position of the polyurea film 12 and the polyimide film 18. Therefore, the ion implantation may be performed with high precision to a predetermined position of the SiC layer 11. According to a method of the embodiment of the present disclosure, it is possible to micronize the pattern formed in each film and the region to be ion-implanted in the SiC layer 11. As a result, the micronization of the wiring of a semiconductor device manufactured using the wafer W can be attained.

Figure 8A:
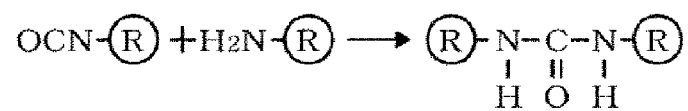
FIGS. 8A and 8B are explanatory diagrams showing reactions for forming a urea film.
Figure 8B:
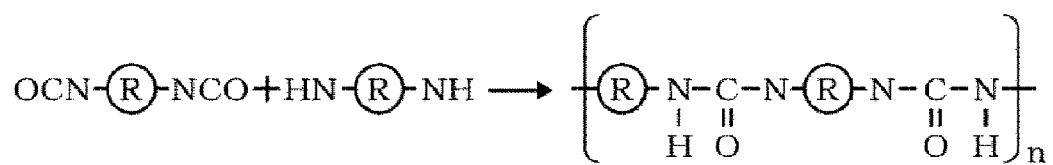
Figure 9A:
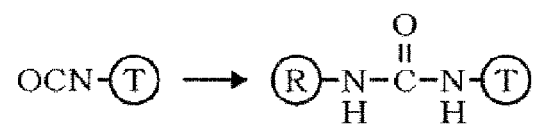
FIGS. 9A to 9E are explanatory diagrams showing an example of a substitution film formed by substitution of a polyurea film and a substitution gas for forming the substitution film.
Figure 9B:
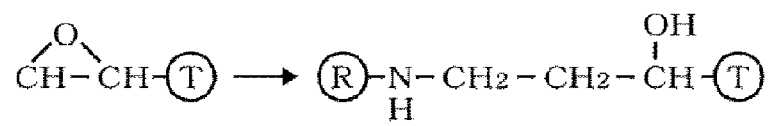
Figure 9C:
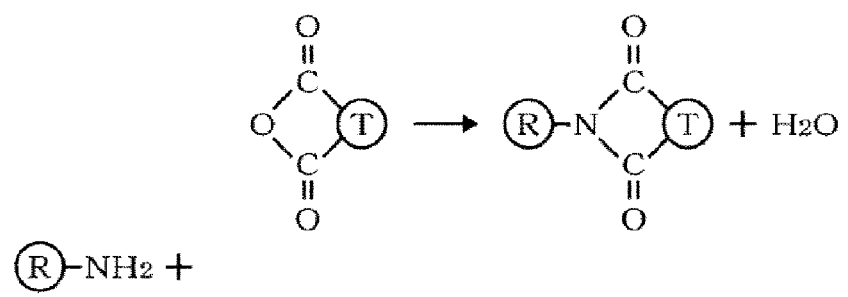
Figure 9D:
Figure 9E:
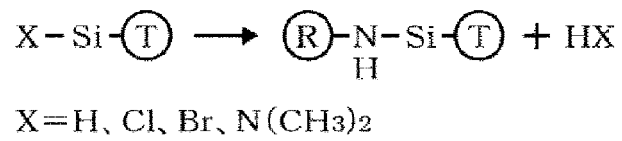
Figure 10A:
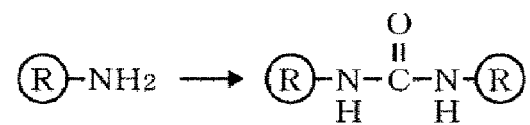
FIGS. 10A to 10C are explanatory diagrams showing an example of a substitution film formed by substitution of a polyurea film and a substitution gas for forming the substitution film.
Figure 10B:
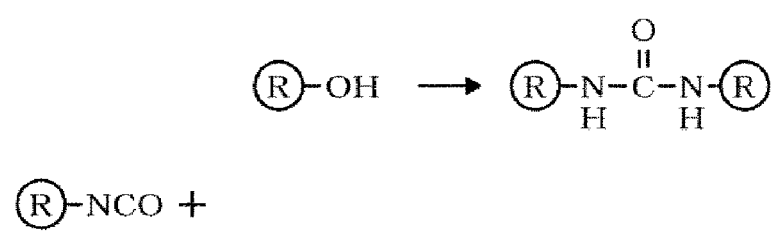
Figure 10C:
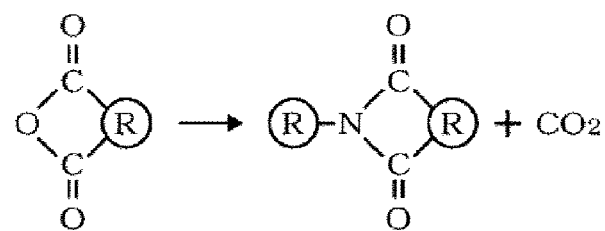

FIGS. 8A and 8B show examples of raw material monomers other than those shown in FIG. 5. The urea film formed as a mask on the wafer W is not limited to a polymeric compound, such as the polyurea film 12, and may be an oligomer, or the urea film may be formed using amine and isocyanate as raw material monomers, which form the oligomer, as shown in FIG. 8A. In addition, as shown in FIG. 8B, isocyanate and secondary amine may be used as raw material monomers, and in this case, the produced polymer includes a urea bond as well.

The film substitution gas is not limited to a gas containing PMDA, and the material of the film (substitution film) formed by substituting the polyurea film 12 is not limited to polyimide. FIGS. 9A to 9E and FIGS. 10A to 10C show examples of the compounds constituting the film substitution gas. The respective compounds shown in FIGS. 9A to 9E react with the amine generated by depolymerization of the polyurea film 12 to thus produce compounds shown at the end of the respective arrows so that the resultant compounds constitute the substitution film. The respective compounds shown in FIGS. 10A to 10C react with the isocyanate generated by depolymerization of the polyurea film 12 to thus produce compounds shown at the end of the respective arrows so that the resultant compounds constitute the substitution film.

Figure 11A:
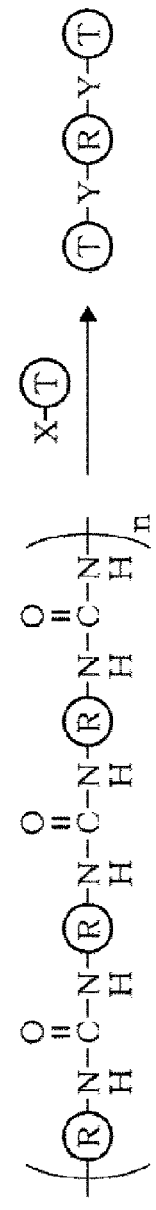
FIGS. 11A and 11B are explanatory diagrams showing an example of a substitution film formed by substitution of a polyurea film and a substitution gas for forming the substitution film.
Figure 11B:
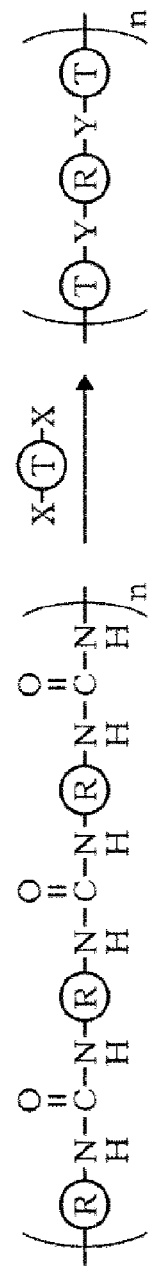

FIGS. 11A and 11B show other examples of the compounds for the substitution film. The drawings show the compounds constituting the film substitution gas, and X in the compounds represents an amino group or an isocyanate group and a functional group combined therewith. Thus, FIGS. 11A and 11B show examples of the compounds for the substitution film that is formed by supplying a compound having one amino group and two isocyanate groups as a film substitution gas. Y in the compound of the substitution film indicates the formed bond. In the case of FIG. 11A, a compound having a structure in which a frame of polyurea (indicated by R) is interposed between two frames of a film substitution gas (indicated by T) may be produced as a compound of the substitution film. In the case of FIG. 11B, a polymer having a structure in which the frame R and the frame T are repeatedly crosslinked through the bond Y may be produced as a compound of the substitution film.

Figure 12:
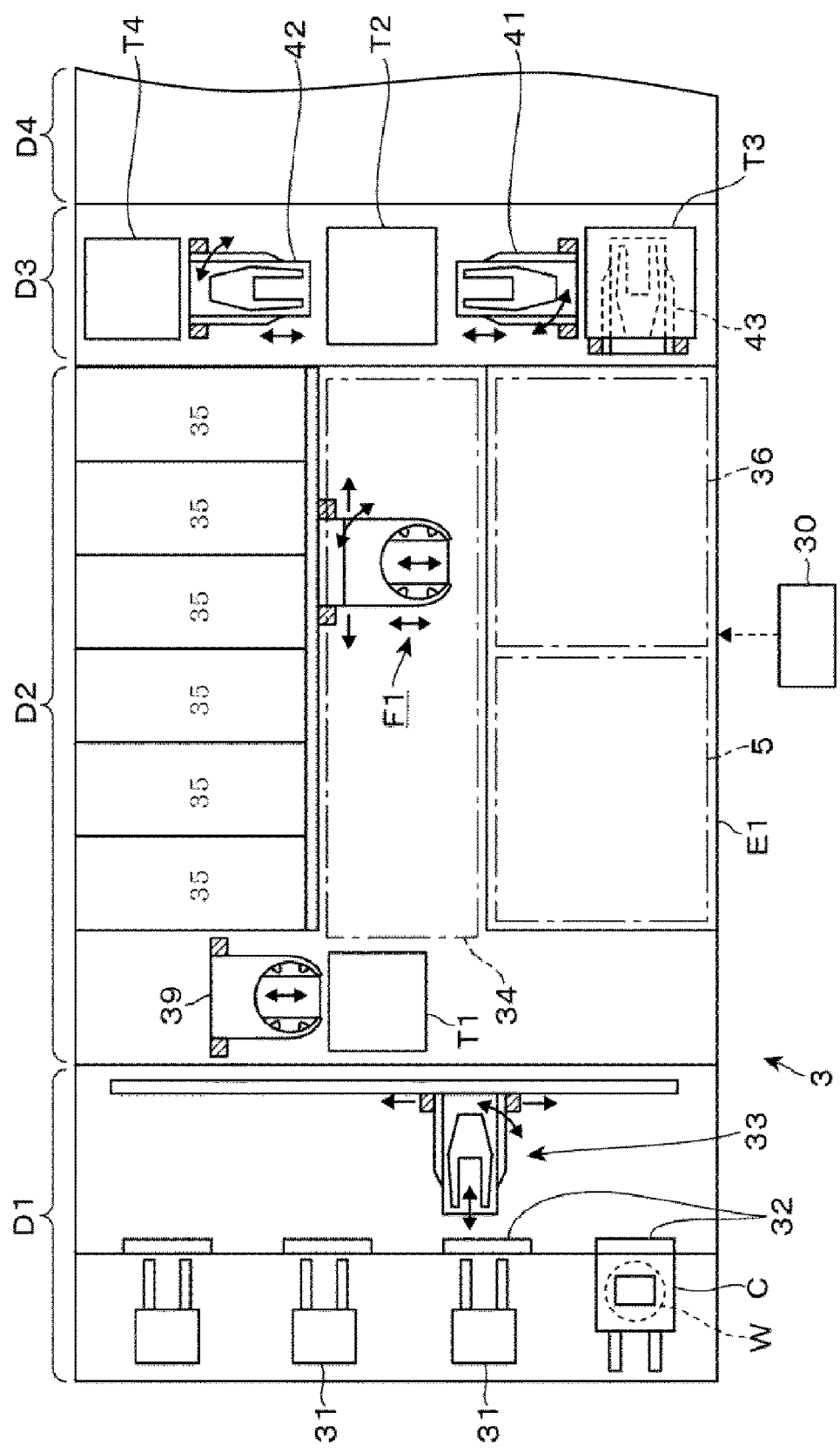
FIG. 12 is a plan view of a coating and developing apparatus for carrying out the method of manufacturing a semiconductor device.
Figure 13:
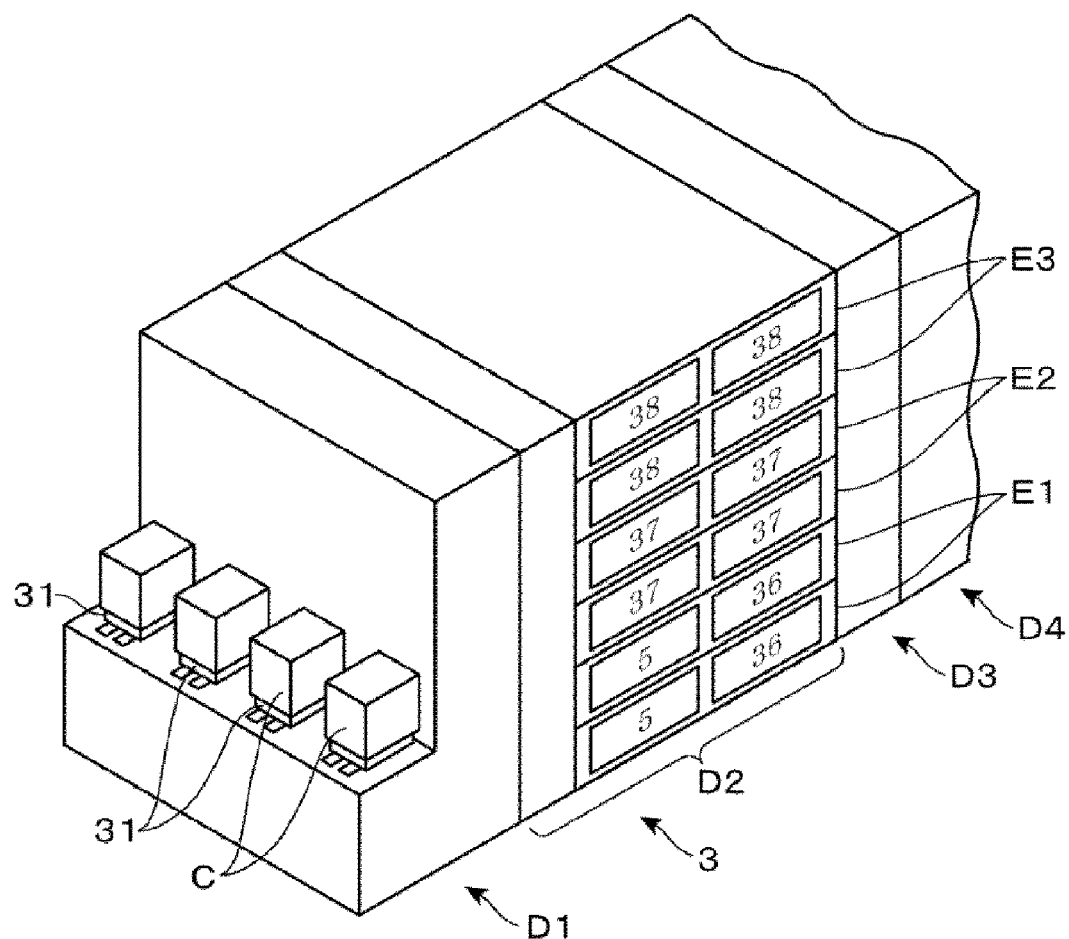
FIG. 13 is a perspective view of the coating and developing apparatus.
Figure 14:
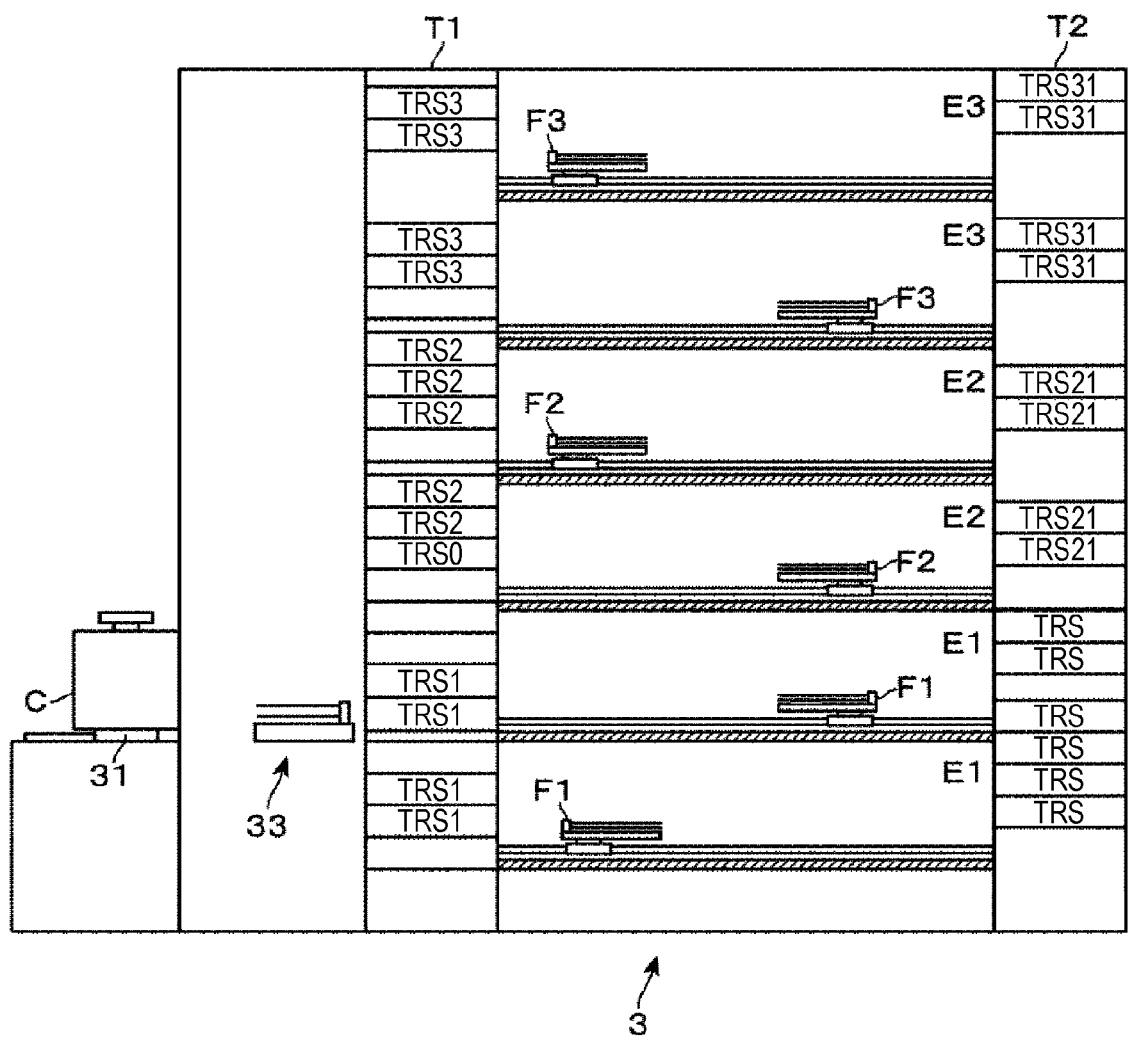
FIG. 14 is a longitudinal sectional side view of the coating and developing apparatus.

Subsequently, a coating and developing apparatus 3, which is a substrate processing apparatus for performing a series of processes from the formation of the polyurea film 12 to the formation of the resist pattern described in FIGS. 1A to 2B, will be described with reference to FIGS. 12 to 14. FIG. 12, FIG. 13, and FIG. 14 are a plan view, a perspective view, and a schematic longitudinal sectional side view of the coating and developing apparatus 3, respectively. The coating and developing apparatus 3 performs processes under an atmospheric pressure.

The coating and developing apparatus 3 is configured by linearly connecting a carrier block D1, a processing block D2, and an interface block D3 in a lateral direction. An exposure apparatus D4 is connected to the interface block D3. In the following description, the arranged direction of the blocks D1 to D3 is defined as a forward/backward direction. The carrier block D1 includes a stage 31 for a carrier C, an opening/closing part 32 provided in front of the carrier C loaded on the stage 31 so as to be opened and closed together with a cover of the carrier C, and a transfer mechanism 33 for transferring the wafer W between a space inside the carrier C and a space inside the carrier block D1 through the opening/closing part 32.

The processing block D2 is configured by sequentially stacking six unit blocks E, which perform liquid processing on the wafer W, from the bottom. Three types of unit blocks E1 to E3 are provided in two layers for the six unit blocks E, and the same unit blocks have the same configurations and perform the same processing. In addition, the respective unit blocks E transfer and process the wafer W independently.

Now, the unit block E1 shown in FIG. 12 will be described. A transfer area 34 of the wafer W is provided from the carrier block D1 to the interface block D3, and a plurality of heating modules 35, which are heat-processing parts, is provided in one of the left and right sides of the transfer area 34 along the forward/backward direction. A polyurea film forming module 5 and an inorganic film forming module 36 for forming the inorganic film 13 are provided in the other of the left and right sides of the transfer area 34 along the forward/backward direction. The polyurea film forming module 5 is intended to apply a chemical liquid to the surface of the wafer W to thus form the polyurea film 12, which will be described in detail later. The inorganic film forming module 36 is intended to apply a chemical liquid for forming the inorganic film 13 to the surface of the wafer W.

In addition, a transfer arm F1 for transferring the wafer W is provided in the transfer area 34.

The unit block E2 has the same configuration as the unit block E1, except that two resist film forming modules 37 are provided, instead of the polyurea film forming module 5 and the inorganic film forming module 36. The resist film forming module 37 is intended to apply a resist, as a chemical liquid, on the surface of the wafer W to thus form the resist film 14.

The unit block E3 has the same configuration as the unit block E1, except that two developing modules 38 are provided, instead of the polyurea film forming module 5 and the inorganic film forming module 36. The developing module 38 is intended to supply a developer, as a chemical liquid, to the surface of the wafer W to develop the resist film 14 and to form a resist pattern. In addition, the inorganic film forming module 36, the resist film forming module 37, and the developing module 38 have the same configuration as the polyurea film forming module 5, except that the types of chemical liquids to be supplied to the wafer W are different from each other and LEDs 57, which will be described later, are not provided. In addition, transfer arms F2 and F3 corresponding to the transfer arm F1 of the unit block E1 are provided in the unit block E2 and E3, respectively. The heating module 35 provided in the unit block E2 is configured as a heat-processing part prior to an exposure processing for heating the wafer W coated with the resist, and the heating module 35 provided in the unit block E3 is configured as a post-exposure heat-processing part for heating the wafer W after the exposure processing.

A tower T1, which extends in the vertical direction over six unit blocks E, and a transfer arm 39, which is a transfer mechanism moving up and down to take and feed the wafer W from and to the tower T1, are provided on the side of the processing block D2 toward the carrier block D1. The tower T1 has a plurality of transfer modules TRS stacked on each other, and the transfer modules provided at heights corresponding to the respective unit blocks E1 to E3 may take and feed the wafer W from and to the respective transfer arms F1 to F3 of the unit blocks E1 to E3.

Towers T2, T3, and T4 extending vertically over six unit blocks E are provided in the interface block D3. In addition, an interface arm 41, which is a transfer mechanism that moves up and down, for taking and feeding the wafer W between the tower T2 and the tower T3, an interface arm 42, which is a transfer mechanism that moves up and down, for taking and feeding the wafer W between the tower T2 and the tower T4, and an interface arm 43, which is a transfer mechanism, for taking and feeding the wafer W between the tower T2 and the exposure apparatus D4 may be further provided.

The tower T2 includes transfer modules TRS, a buffer module for storing and holding a plurality of wafers W before the exposure processing, a buffer module for storing a plurality of wafers W after exposure processing, and a temperature control module for adjusting the temperature of the wafer W, which are stacked on each other, but the buffer module and the temperature control module are not shown in the drawings. Although the towers T3 and T4 also have modules for transferring the wafers W, respectively, a description thereof will be omitted here.

Figure 15:
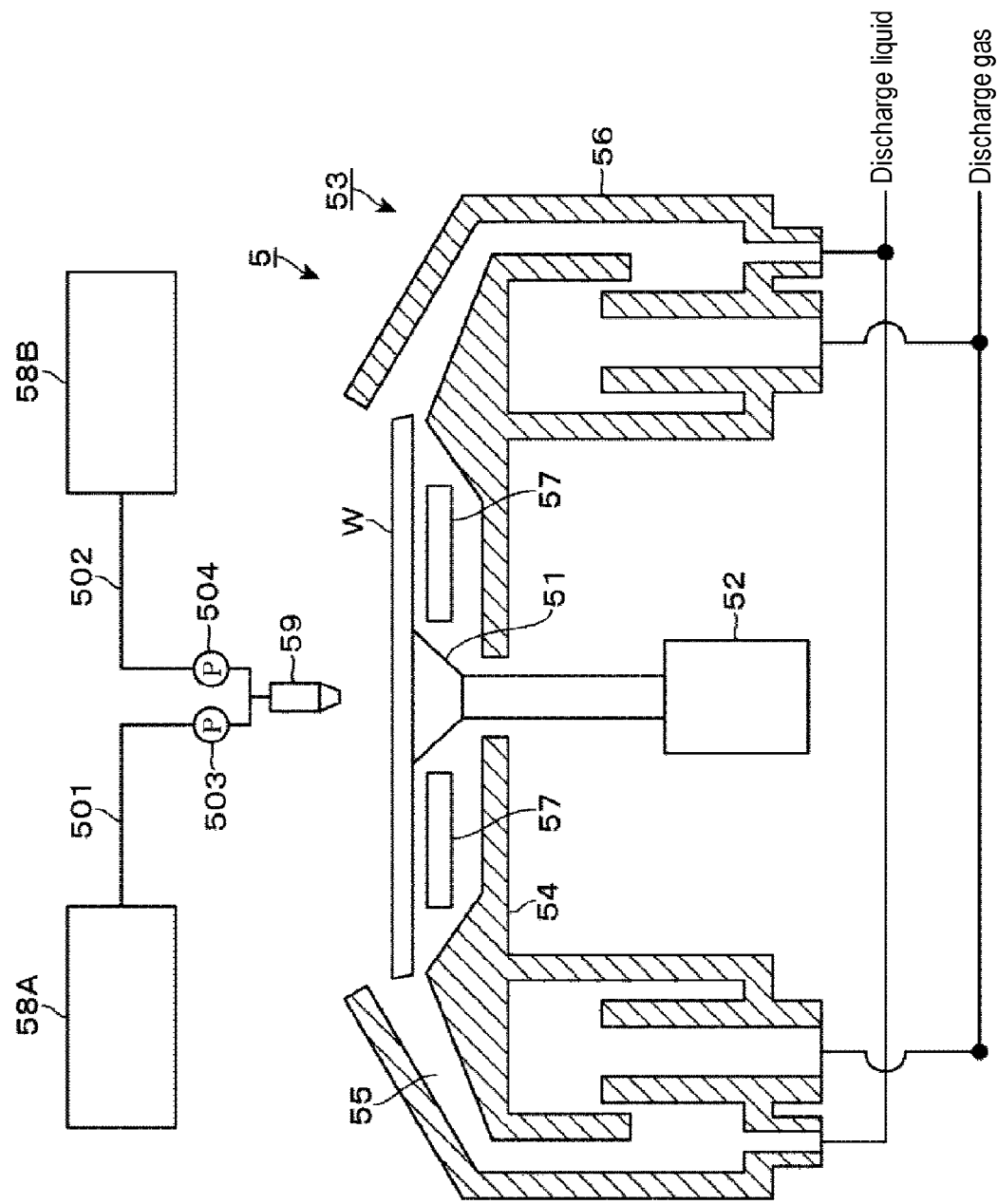
FIG. 15 is a longitudinal sectional side view of a module, which is provided in the coating and developing apparatus, for forming a polyurea film.

The polyurea film forming module 5 will be described with reference to FIG. 15. In the drawing, reference numeral 51 denotes a vacuum chuck that is a stage rotated by a rotating mechanism 52 to hold the wafer W via suction, reference numeral 53 denotes a cup module, and reference numeral 54 denotes a guide member having an inner circumferential wall and an outer circumferential wall extending downwards in a cylindrical shape. Reference numeral 55 represents a discharge space formed between an outer cup 56 and the outer circumferential wall over the entire circumference thereof so as to discharge gases and liquids, and a gas-liquid separation structure is provided in the lower portion of the discharge space 55. Reference numeral 57 in the drawing, for example, denotes an LED (light emitting diode) for heating the wafer W by irradiating light thereonto from the lower side, so that the wafer W is heated for polymerization while a chemical liquid is supplied thereto as will be described later.

A solution of the diamine described in FIG. 5 (referred to as a first chemical liquid), from a supply source 58A, and a solution of the diisocyanate described in FIG. 5 (referred to as a second chemical liquid), from a supply source 58B, are supplied to a chemical liquid nozzles 59, respectively, and these solutions get mixed just before entering the chemical liquid nozzle 59 to thus form a mixed solution. That is, the first chemical liquid and the second chemical liquid are mixed just before being supplied to the substrate. Then, the chemical liquid nozzle 59 discharges the mixed solution vertically downwards. The chemical liquid nozzle 59, serving as a raw material discharging part, is connected to a driving mechanism (not shown) and is configured to move between the position above the center of the wafer W and the outside of the outer cup 56.

The processing of the wafer W by the polyurea film forming module 5 will be described. First, the mixed solution is supplied to the central portion of the wafer W from the chemical liquid nozzle 59 serving as a raw material discharging part while the wafer W is rotated at a predetermined rotational speed so that the mixed solution spreads on the surface of the wafer W. That is, the wafer W is spin-coated with the first chemical liquid and the second chemical liquid, respectively. Then, the mixed solution on the surface of the wafer W is heated to thus remove the solvent in the solution and to thus form the polyurea film 12.

One of the first chemical solution and the second chemical solution may be supplied first to the wafer W, and then the other thereof may be supplied thereto, thereby forming the film. In this case, a diamine chemical liquid nozzle 59 connected to the supply source 58A and a diisocyanate chemical liquid nozzle 59 connected to the supply source 58B may be provided, and the chemical liquids may be discharged from the chemical liquid nozzles 59 to the wafer W. Alternatively, the first chemical liquid and the second chemical liquid may be sequentially supplied from the common nozzle 59 connected to the supply sources 58A and 58B, as shown in FIG. 15. In this case, either the first chemical liquid or the second chemical liquid may be supplied first. As described above, a method of supplying the chemical liquids to the wafer W includes a method of supplying various chemical liquids by mixing the same just before being supplied to the wafer W and a method of supplying various chemical liquids in sequence thereto. The sequential supply of the chemical liquids includes alternately and repeatedly supplying the respective chemical liquids, as well as supplying the chemical liquids once for each thereof.

The chemical liquid nozzle 59 may be configured to discharge the chemical liquids, which are supplied from the supply sources 58A and 58B, to the wafer W in the form of a mist. Even when the mist is supplied to the wafer W, the chemical liquids may be mixed just before being supplied to the wafer W, and the mixed liquids may be discharged in the form of a mist from the chemical liquid nozzle 59, or the chemical liquids may be sequentially supplied to the chemical liquid nozzle 59 to then be discharged in the form of a mist. As described above, the supply of liquids for polymerization to the substrate includes supplying the liquids to the substrate by forming a liquid flow and supplying the liquids in the form of a mist. In addition, the mist may be supplied to the wafer W while the wafer W is stopped without being rotated. Furthermore, the inorganic film forming module 36, the resist film forming module 37, and the developing module 38 have the same configuration as the polyurea film forming module 5, except that the types of liquids supplied to the wafer W are different and the LEDs 57 are not provided.

The mixing of the first chemical liquid and the second chemical liquid just before being supplied to the wafer W is intended to prevent the formation of the polyurea in the chemical liquid flow path before being supplied to the wafer W. The configuration of the polyurea film forming module 5 will be described in more detail. The supply source 58A and the supply source 58B are connected to the chemical liquid nozzle 59 through a flow path 501 and a flow path 502, respectively. The supply source 58A and the supply source 58B are provided with tanks for storing the first chemical liquid and the second chemical liquid, respectively, and pumps 503 and 504 for feeding, by pressure, the respective chemical liquids to the chemical liquid nozzle 59 stored in the supply sources 58A and 58B are provided on the flow paths 501 and 502, respectively. For example, the flow paths 501 and 502 join at the downstream side of the pumps 503 and 504 to thus form a joining flow path, and the downstream end of the joining flow path is connected to the chemical liquid nozzle 59. According to this configuration, the first chemical liquid and the second chemical liquid may be mixed to form a mixed solution just before being supplied to the wafer W as described above. Although the flow paths 501 and 502 join at the upstream side of the chemical liquid nozzle 59 in the example shown in FIG. 15, the ends of the flow paths 501 and 502 may join in the chemical liquid nozzle 59. In this case, the flow path inside the chemical liquid nozzle 59 forms a joining flow path at the downstream side of the flow paths 501 and 502.

The joining position of the flow paths 501 and 502 will be described in more detail. In order to prevent the uniformity of the film thickness inside the surface of the wafer W from deteriorating, which is caused by the polymerization reaction occurring in the mixed solution of the first chemical liquid and the second chemical liquid before being supplied to the wafer W, the joining position of the flow paths 501 and 502 is preferably determined to be close to the wafer W. That is, the joining position is determined for the purpose of preventing the polymerization reaction from occurring due to the elapse of a relatively long time from the mixing of the first chemical liquid and the second chemical liquid until the supply thereof to the wafer W, and of preventing the polymerization reaction from occurring due to heat from the heated wafer W at the mixing position of the chemical liquids.

More specifically, the flow paths 501 and 502, for example, are configured to join each other in the chemical liquid nozzle 59, as described above, to thus form a joining flow path extending toward a discharge outlet in the lower portion of the chemical liquid nozzle 59. That is, the first chemical liquid and the second chemical liquid are mixed in the chemical liquid nozzle 59. In addition, it is preferred to dispose the chemical liquid nozzle 59 to be spaced from the wafer W (for example, to be spaced upwards by a few centimeters from the surface of the wafer W) such that the upstream end of the joining flow path in the chemical liquid nozzle 59 is positioned near the surface of the wafer W so as to discharge the mixed solution of the chemical liquids. Since the upstream end of the joining flow path is disposed near the wafer W, the influence of the heat received from the wafer W is suppressed, and thus the temperature at the upstream end of the joining flow path is lower than that of the wafer W. For example, the temperature of the upstream end is in the range from the temperature of the chamber (e.g., 23 degrees C.), in which the polyurea film forming module 5 is provided, to 120 degrees C. Therefore, the progress of the polymerization reaction at the upstream end of the joining flow path may be suppressed. Since the upstream end of the joining flow path is provided in the chemical liquid nozzle 59 as described above, the chemical liquid nozzle 59 is disposed such that the temperature of the chemical liquid nozzle 59 may be controlled to be lower than that of the wafer W.

Reference numeral 30 in FIG. 12 denotes a controller provided in the coating and developing apparatus 3, and the controller 30 includes a program, a memory, and a CPU. The program is stored in a computer storage medium, such as a compact disk, a hard disk, a magneto-optical disk, or the like, and is installed in the controller 30. The controller 30 outputs control signals to respective parts of the coating and developing apparatus 3 by means of the program to thus control the operations of the respective parts. Specifically, the program controls operations of transferring the wafer W between the modules by means of respective transfer mechanisms and of processing the wafer W in the respective modules in the coating and developing apparatus 3, and has a step group that is configured to execute a series of processes for the wafer W described in FIG. 1A to FIG. 2B.

Transfer paths of the wafer W in the system comprised of the coating and developing apparatus 3 and the exposure device D4 will be described. As described in FIG. 1A, the carrier C storing the wafers W, each of which has the SiC layer 11 on the surface thereof, is loaded on the stage 31 of the carrier block D1, and is transferred, by the transfer mechanism 33, to the transfer module TRS0 of the tower T1 in the processing block D2. The wafer W is transferred from the transfer module TRS0 to the transfer module TRS1 (the transfer module that can feed and take the wafers W by means of the transfer arm F1) corresponding to the unit block E1 by the transfer arm 39.

Thereafter, the wafer W is transferred from the transfer module TRS1 to the polyurea film forming module 5 by the transfer arm F1 so that the polyurea film 12 is formed thereon as shown in FIG. 1B and the wafer W is transferred to the inorganic film forming module 36 to then be applied with a chemical liquid. Next, the wafer W is transferred to the heating module 35 so as to be heated such that the solvent in the chemical liquid evaporates, thereby forming the inorganic film 13 as shown in FIG. 1C. Subsequently, the wafer W is transferred to the transfer module TRS1, and is then transferred by the transfer arm 39 to the transfer module TRS2 corresponding to the unit block E2.

Then, the wafer W is transferred from the transfer module TRS2 to the resist film forming module 37 by the transfer arm F2 to then be coated with a resist, and is transferred to the heating module 35 so as to evaporate the solvent in the resist, thereby forming the resist film 14 as shown in FIG. 2A. Thereafter, the wafer W is transferred to the transfer module TRS21 of the tower T2 and is carried into the exposure apparatus D4 through the tower T3 by the interface arms 41 and 43 so that the resist film 14 is exposed according to a predetermined pattern. The exposed wafer W is transferred between the towers T2 and T4 by the interface arms 41 and 43 and is transferred to the transfer module TRS31 of the tower T2 corresponding to the unit block E3.

Next, the wafer W is transferred to the heating module 35 by the transfer arm F3 so as to be subjected to the post-exposure baking processing, and then is transferred to the developing module 38 to be supplied with a developer, thereby forming a resist pattern as shown in FIG. 2B. Thereafter, the wafer W is transferred to the transfer module TRS3 corresponding to the unit block E3 of the tower T1 and is returned to the carrier C by the transfer mechanism 33.

Now, the vacuum processing apparatus 6 for performing the processes from the formation of the pattern on the inorganic film 13 to the ion implantation described in FIGS. 2C to 4 will be described with reference to a plan view of FIG. 16. The vacuum processing apparatus 6 is provided with a laterally long atmospheric transfer chamber 61 of which the inner space is maintained at the atmospheric pressure by means of, for example, a dry $N_2$ gas and loading/unloading ports 62 for loading the carriers C are arranged in the lateral direction in front of the atmospheric transfer chamber 61. Doors 63 are provided on the front wall of the atmospheric transfer chamber 61 so as to be opened and closed together with the lid of the carrier C. A first transfer mechanism 64 comprised of articulated arms for transferring the wafer W is provided in the atmospheric transfer chamber 61. In addition, an alignment chamber 65 for adjusting the orientation and eccentricity of the wafer W is provided on the left wall of the atmospheric transfer chamber 61, as viewed from the loading/unloading ports 62.

For example, two load lock chambers 66A and 66B are arranged side by side in the opposite side of the loading/unloading ports 62 in the atmospheric transfer chamber 61. A gate valve 67 is provided between the load lock chambers 66A and 66B and the atmospheric transfer chamber 61. A vacuum transfer chamber 68 is disposed on the inner side of the load lock chambers 66A and 66B, as viewed from the atmospheric transfer chamber 61, with a gate valve 69 interposed therebetween.

An etching processing module 7, a film substitution module 8, and a doping module 9 are connected to the vacuum transfer chamber 68 through gate valves 6A. The vacuum transfer chamber 68 is provided with a second transfer mechanism 6B having two transfer arms comprised of articulated arms, and the second transfer mechanism 6B takes and feeds the wafers W between the load lock chambers 66A and 66B and the modules connected to the vacuum transfer chamber 68.

Next, the etching processing module 7 will be described with reference to FIG. 17, which is a longitudinal sectional side view thereof. The etching processing module 7 is configured to form capacitively coupled plasma to thus perform the respective etching processing described above. In the drawings, the reference numeral 71 denotes a grounded processing vessel, which is connected to the vacuum transfer chamber 68 through the gate valve 6A described in FIG. 16. The inner space of the processing vessel 71 is maintained at a vacuum atmosphere of a desired pressure by degassing the same using an exhaust mechanism 72.

Reference numeral 73 in the drawing denotes a stage on which the wafer W is loaded, and a heater (not shown) for heating the wafer W is embedded therein. The stage 73 is disposed on the bottom surface of the processing vessel 71 while being electrically connected and functions as a lower electrode and an anode electrode. In addition, the stage 73 includes an elevating pin, which is not shown, protruding and retracting from the surface of the stage 73 so as to support the back surface of the wafer W, thereby allowing the wafer W to be loaded and unloaded by the second transfer mechanism 6B. In addition, the illustration of the elevating pin will be omitted when other modules connected to the vacuum transfer chamber 68 are described.

A shower head 74 is provided above the stage 73 so as to face the upper surface of the stage 73. Reference numeral 75 in the drawing denotes an insulating member for insulating the shower head 74 from the processing vessel 71. A high-frequency power source 76 for generating plasma is connected to the shower head 74 and the shower head 74 functions as a cathode electrode. Reference numeral 77 in the drawing denotes a gas supply part for supplying etching gases used for the inorganic film 13, the polyurea film 12, and the resist film 14, respectively, to a diffusion space 78 formed in the shower head 74. The etching gas supplied to the diffusion space 78 is supplied from the discharge outlet of the shower head 74 to the wafer W in a form of a shower. When the etching gas is supplied to the wafer W, the high-frequency power source 76 is turned on to form an electric field between the electrodes and to thus convert the etching gas to plasma, thereby etching the film on the surface of the wafer W.

Figure 18:
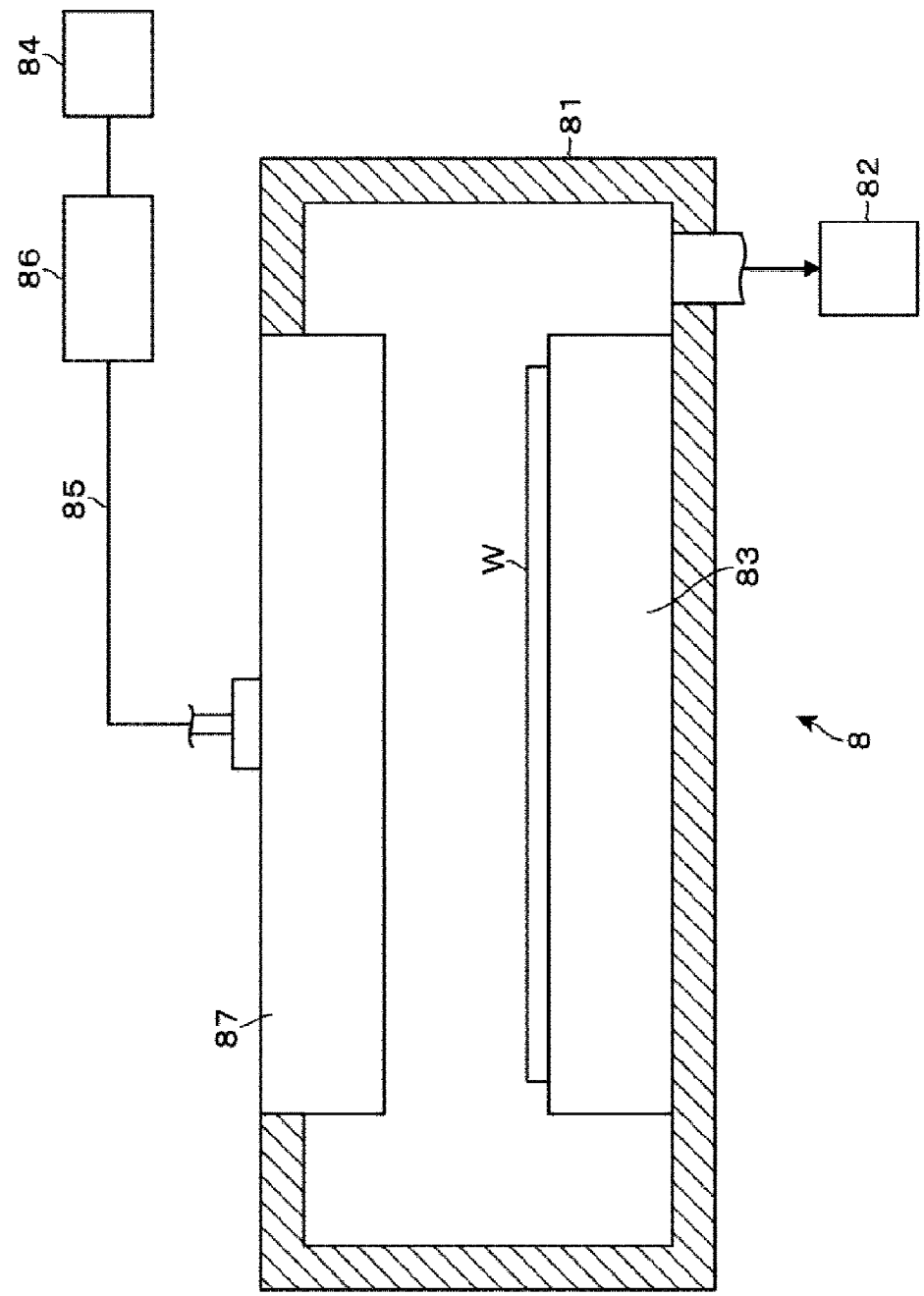
FIG. 18 is a longitudinal sectional side view of a substitution module, which is provided in the vacuum processing apparatus, for substituting a film.

Subsequently, the film substitution module 8 for substituting the polyurea film 12 with the polyimide film 18 will be described with reference to FIG. 18, which is a longitudinal sectional side view thereof. Like the etching processing module 7, the film substitution module 8 has a processing vessel 81 connected, through the gate valve 6A, to the vacuum transfer chamber 68 of which the inner space is maintained in a vacuum atmosphere at a desired pressure. Reference numeral 82 in the drawing denotes an exhaust mechanism for exhausting the processing vessel 81 to form a vacuum atmosphere. A stage 83 having a heater is provided in the processing vessel 81, and the wafer W loaded on the stage 83 is heated to the temperature described above (e.g., 200 degrees C. to 300 degrees C.), thereby performing the substitution process of the film. Reference numeral 84 in the drawing denotes a supply source containing a solution including PMDA. The solution is vaporized by a vaporizer 86 positioned in a supply pipe 85 to become a film substitution gas and is supplied to the shower head 87, which is a gas discharger. The shower head 87 has a plurality of discharge holes formed on the lower surface thereof and discharges the film substitution gas to the wafer W therethrough.

Figure 19:
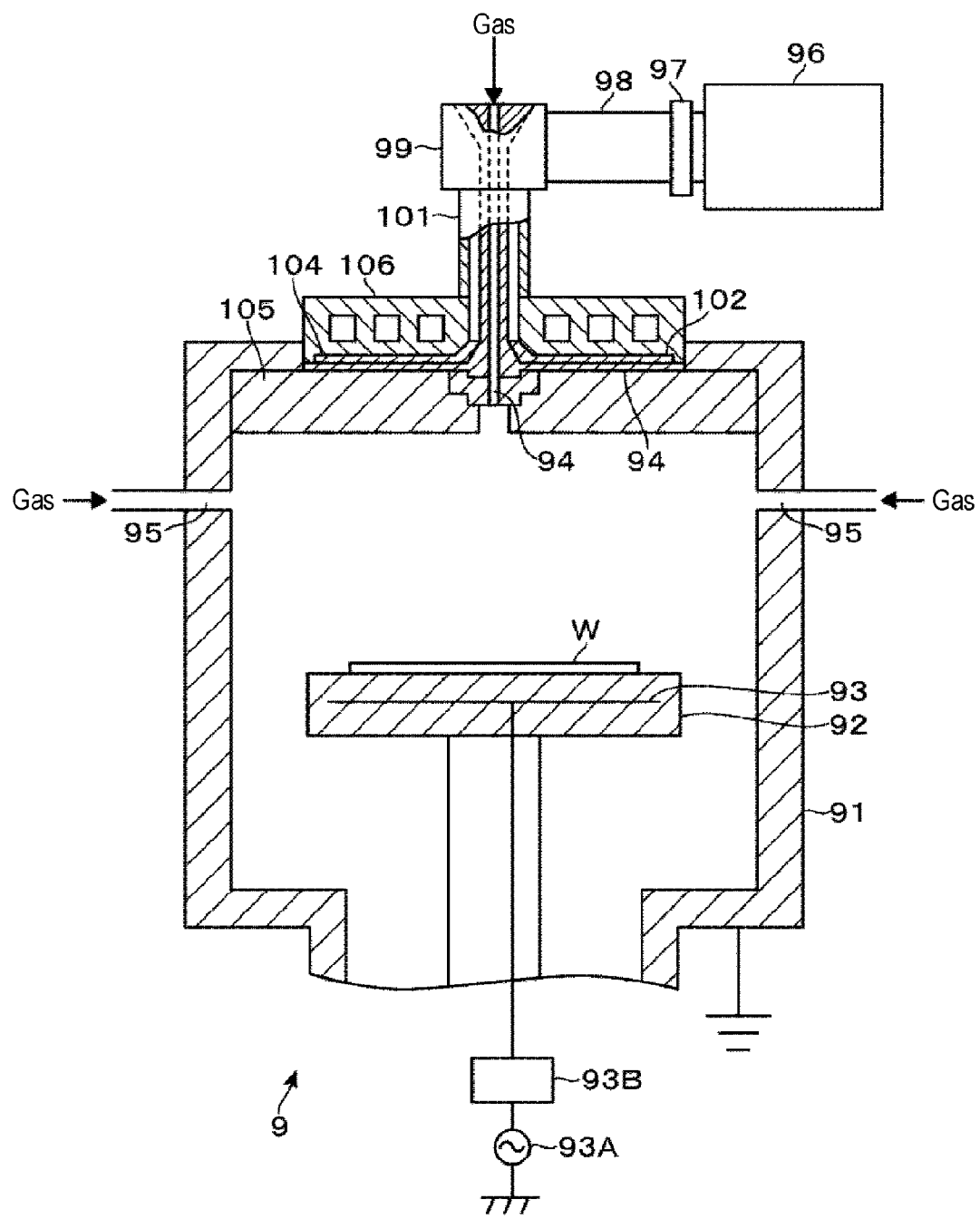
FIG. 19 is a longitudinal sectional side view of a doping module provided in the vacuum processing apparatus.

Next, the doping module 9 will be described with reference to FIG. 19, which is a longitudinal sectional side view thereof. Reference numeral 91 of the drawing denotes a grounded processing vessel, which is connected to the vacuum transfer chamber 68 through the gate valve 6A. Reference numeral 92 of the drawing denotes a stage for the wafer W. A heater (not shown) for heating the wafer W and an electrode 93 are embedded in the stage 92, and a high-frequency power source 93A for RF (radio frequency) bias is connected to the electrode 93 through a matching unit 93B. Reference numeral 94 in the drawing denotes an exhaust port for maintaining the interior of the processing vessel 91 in a vacuum atmosphere at a desired pressure by exhausting the same. In addition, the doping module 9 is provided with a first gas supply part 94 for discharging a plasma excitation inert gas and a doping gas, such as $BF_3$ (boron trifluoride) or the like, from above to the center of the wafer W and a second gas supply part 95 for discharging the same laterally from the outside of the wafer W.

Reference numeral 96 in the drawing denotes a microwave generator for generating a plasma excitation microwave and is connected to the upper portion of a coaxial waveguide 101 through a matcher 97, a waveguide 98, and a mode converter 99. The mode converter 99 converts the microwave in a TE mode, which is supplied from the microwave generator 96, into a microwave in a TEM mode and supplies the same to the coaxial waveguide 101. The microwave is supplied from the coaxial waveguide 101 to the central portion of a dielectric member 102 constituting the ceiling of the processing vessel 91 and radially propagates along the dielectric member 102 to thus be radiated onto a dielectric window 105, which is provided under a slot antenna plate 104 so as to face the stage 92, through a plurality of slot holes (through-holes) (not shown) formed in the slot antenna plate 104 provided under the dielectric member 103. The microwave passing through the dielectric window 105 generates an electric field just below the dielectric window 105 to convert the gases, which are supplied from the first gas supply part 94 and the second gas supply part 95 into the processing vessel 91, into plasma. In addition, reference numeral 106 in the drawing denotes a cooling part having paths for cooling water to adjust the temperature of the dielectric member 102 or the like.

As described above, the radicals and ions contained in the plasma formed just below the dielectric window 105 enter the wafer W on the stage 92 applied with a bias, thereby performing doping. Thus, the doping described herein includes ion implantation. In addition, the ion implantation may be conducted using an ion implantation apparatus configured to: convert a gas or a vapor of a solid into plasma in an ion source; extract ions from the plasma; separate desired ions through mass analysis by means of a mass spectrometer; and radiate an ion beam using the separated ions onto the wafer W through an acceleration tube.

Figure 16:
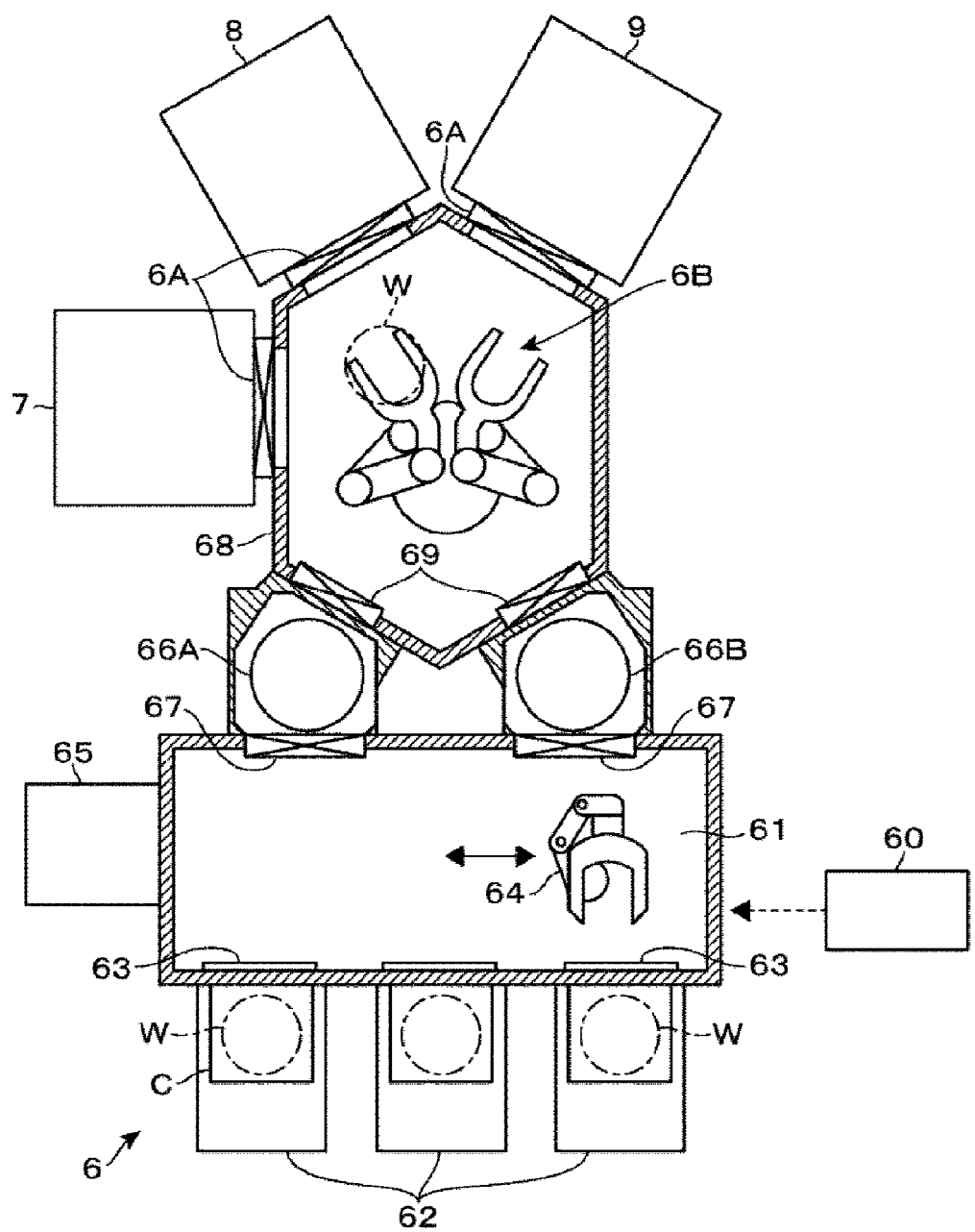
FIG. 16 is a plan view of a vacuum processing apparatus for carrying out the method of manufacturing a semiconductor device.
Figure 17:
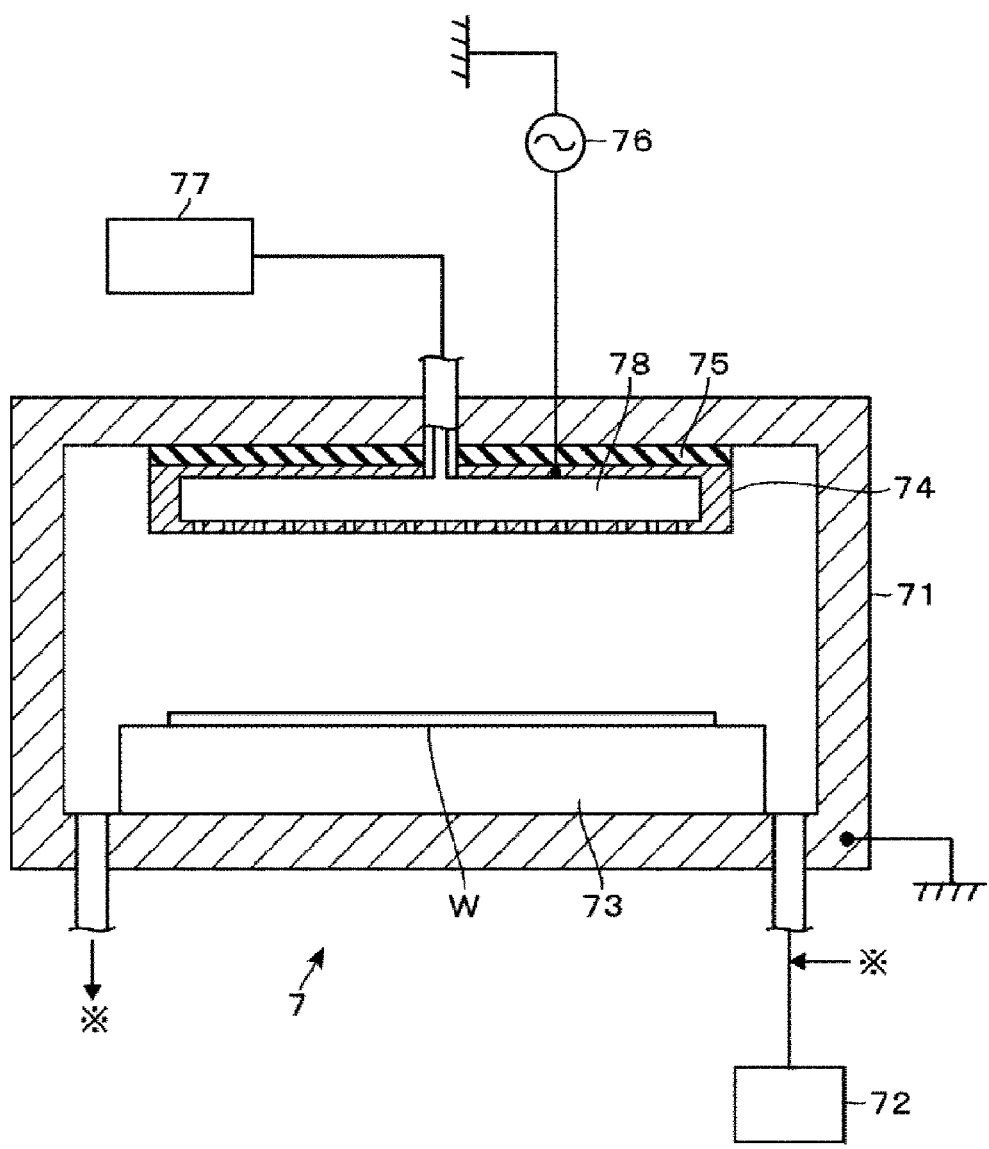
FIG. 17 is a longitudinal sectional side view of an etching processing module provided in the vacuum processing apparatus.

As shown in FIG. 16, like the coating and developing apparatus 3, the vacuum processing apparatus 6 includes a controller 60, and a program stored in a storage medium constituting the controller 60 outputs control signals to the respective parts of the vacuum processing apparatus 6 so as to control the operations thereof. More specifically, the program controls the operations of transferring the wafer W in the vacuum processing apparatus 6, supplying the gases to the wafer W and stopping the same in the respective modules, forming plasma by switching on and off the high-frequency power source, and adjusting the pressure in the respective modules, and has a step group for performing a series of processes with respect to the wafer W, as described above with reference to FIG. 2C to FIG. 4.

The operation of the vacuum processing apparatus 6 will now be described. For example, when the carrier C storing the wafers W, which have been processed in the coating and developing apparatus 3, is transferred into the vacuum processing apparatus 6 by a transfer mechanism (not shown) to thus be loaded on the loading/unloading port 62, the wafer W in the carrier C is taken out and transferred to the atmospheric transfer chamber 61, the alignment chamber 65, and the load lock chamber 66A, in sequence, by the first transfer mechanism 64, and then is transferred to the vacuum transfer chamber 68 and the etching processing module 7, in sequence, by the second transfer mechanism 6B. Then, as described in FIG. 2C, the inorganic film 13 is etched by means of a plasma etching gas, such as a $CF_4$ gas, so as to form a mask pattern thereon, and then, as described in FIG. 3A, the formation of a mask pattern and the removal of the resist film 14 are performed by etching the polyurea film 12 using a plasma etching gas such as an oxygen gas. Thereafter, the inorganic film 13 is etched and removed by a plasma etching gas, such as a $CF_4$ gas, as described in FIG. 3B.

Next, the wafer W is transferred to the vacuum transfer chamber 68 and the film substitution module 8, in sequence, by the second transfer mechanism 6B, and the polyurea film 12 is substituted by the polyimide film 18 as described in FIG. 3C. Then, the wafer W is transferred to the vacuum transfer chamber 68 and the doping module 9, in sequence, by the second transfer mechanism 6B, and the ion implantation described in FIG. 4 is performed. Subsequently, the wafer W is transferred to the vacuum transfer chamber 68 and the load lock chamber 66B, in sequence, by the second transfer mechanism 6B, and is returned to the carrier C by the first transfer mechanism 64.

The inorganic film 13 may be removed by wet etching after the etching of the polyurea film 12, and the inorganic film 13 and the polyurea film 12 may be formed by means of CVD instead of the liquid process. For a CVD process, like the film substitution module 8, a CVD module, for example, configured to heat the wafer W in a vacuum atmosphere while supplying a gas to the wafer W may be connected to the vacuum transfer chamber 68 of the vacuum processing apparatus 6. In addition, the etching of the inorganic film 13 may be performed by wet etching under atmospheric pressure.

In the case where the polyurea film 12 is formed by CVD, the CVD module for forming films may have substantially the same configuration, for example, as the film substitution module 8. The film substitution module 8 is different from the CVD module in that, for example, isocyanate and amine in a liquid state, which are stored in separate raw material supply sources 84, respectively, are supplied to the supply pipes 85 connected to the respective raw material supply sources 84 and are vaporized by the vaporizers 86 provided in the respective supply pipes 85 to thus be supplied to the shower head 87. That is, the isocyanate and the amine are vaporized by the separate vaporizers 86, respectively, and are supplied to the shower head 87 through separate supply pipes 85, respectively. The shower head 87 is configured such that, for example, the vapor of the isocyanate and the vapor of the amine supplied through the respective supply pipes 85 pass through separate flow paths formed in the shower head 87 to thus be discharged to the wafer W of the stage 83. The isocyanate and the amine in the respective vapors discharged above are polymerized on the wafer W to form the polyurea film 12.

Although the polyurea film 12 and the inorganic film 13 may be formed by means of a vacuum process as described above, they may be formed by means of a liquid process at atmospheric pressure as in the manner of forming the resist film 14, which is performed subsequently, so that the entire series of processes described in FIG. 1A to FIG. 2B may be conducted in the coating and developing apparatus 3. Furthermore, the inorganic film 13 may be removed by means of dry etching in a vacuum atmosphere as in the manner of the etching of the polyurea film 12 and the substitution by the polyimide film 18, which are a preceding process and a subsequent process thereof, so that the entire series of processes described in FIG. 1A to FIG. 2B may be conducted in the vacuum processing apparatus 6. That is, the coating and developing apparatus 3 and the vacuum processing apparatus 6 are configured to reduce the number of transfers of the carrier C and the wafer W and the number of transfers of the carrier C between the apparatuses during the processes of FIG. 1A to FIG. 4, thereby shortening the time taken for the processes.

Second Embodiment

Next, a second embodiment of a method of manufacturing a semiconductor device of the present disclosure will be described. In the second embodiment, a pattern is formed by etching a film, which is to be etched, formed on the wafer W through a mask that is formed by substitution of the polyurea film 12 with the polyimide film 18. Hereinafter, the second embodiment will be described based on the differences from the first embodiment with reference to FIGS. 20A to 21C.

Figure 20A:
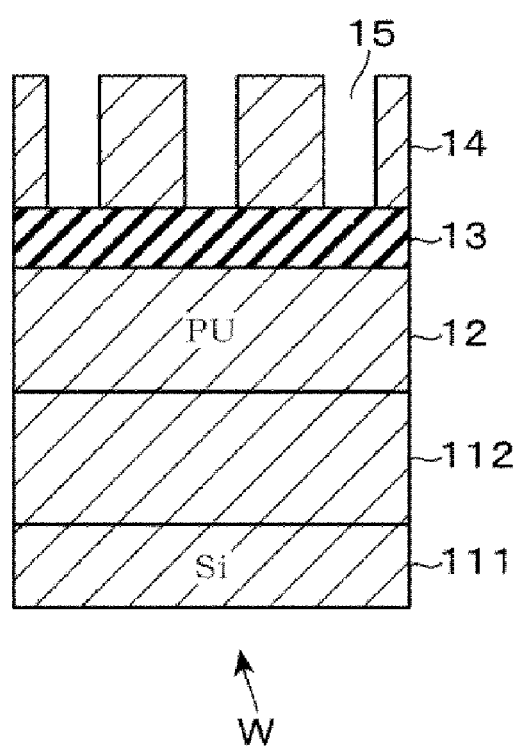
FIGS. 20A and 20B are explanatory diagrams showing some of the processes of a method for manufacturing a semiconductor device according to the embodiment of the present disclosure.
Figure 20B:
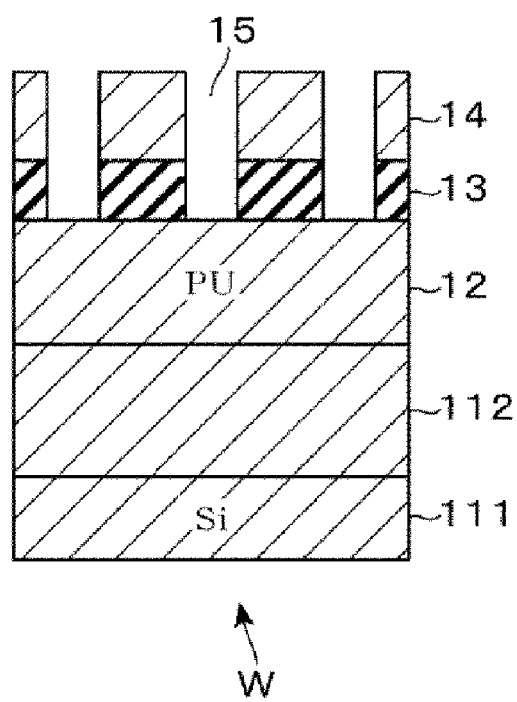

FIG. 20A shows a wafer W in which an Si layer 111, a to-be-etched film 112, a polyurea film 12, an inorganic film 13, and a resist film 14 are sequentially stacked from bottom to top and the resist film 14 has a resist pattern formed with an opening 15. The to-be-etched film 112 may be made of, for example, polysilicon, $SiO_2$ (silicon oxide), Si (silicon), Al (aluminum), or TiN (titanium nitride), and may be formed by CVD or by applying a chemical liquid and then heating the same.

Figure 21A:
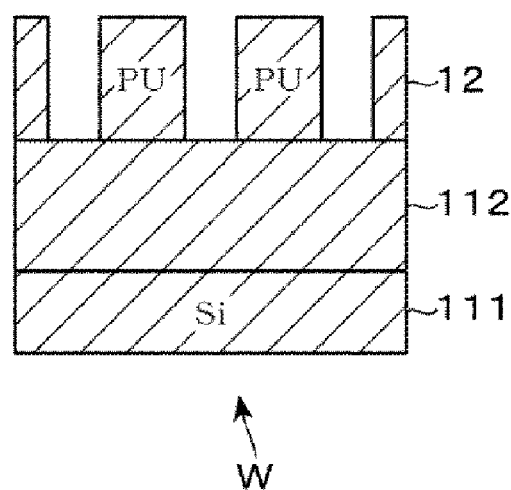
FIGS. 21A to 21C are explanatory diagrams showing some of the processes of a method for manufacturing a semiconductor device according to the embodiment of the present disclosure.
Figure 21B:
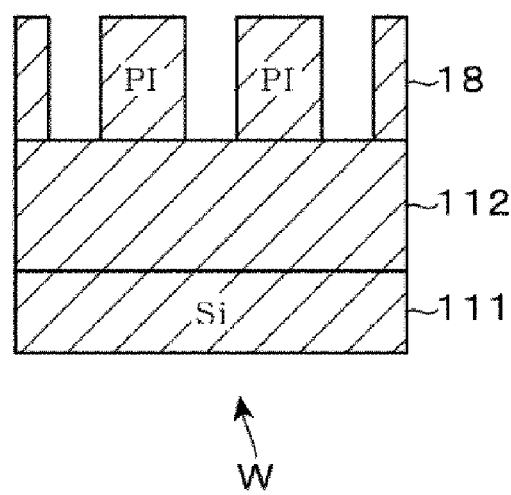
Figure 21C:
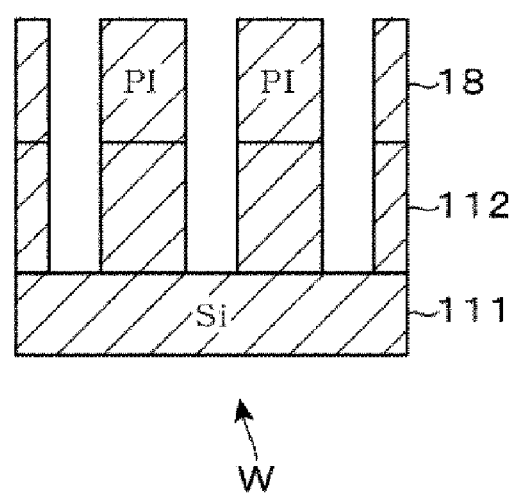

Like the first embodiment, the inorganic film 13 is etched using the resist film 14 as a mask in the state shown in FIG. 20A (FIG. 20B), then the polyurea film 12 is etched using the inorganic film 13 as a mask after removing the resist film 14 (FIG. 21A), and then the polyurea film 12 is substituted with the polyimide film 18 (FIG. 21B). Thereafter, the to-be-etched film 112 constituting a lower layer is etched using the polyimide film 18 as a mask (FIG. 21C). Since the polyimide film 18 has a relatively high etching resistance, the etching processing can be performed such that the opening 113 of a pattern formed by the etching processing reaches the Si layer 111. The above process may be conducted by transferring the wafer W in the vacuum processing apparatus 6 described in the first embodiment and by selecting an appropriate etching gas depending on the to-be-etched film in the etching processing module 7.

Figure 22:
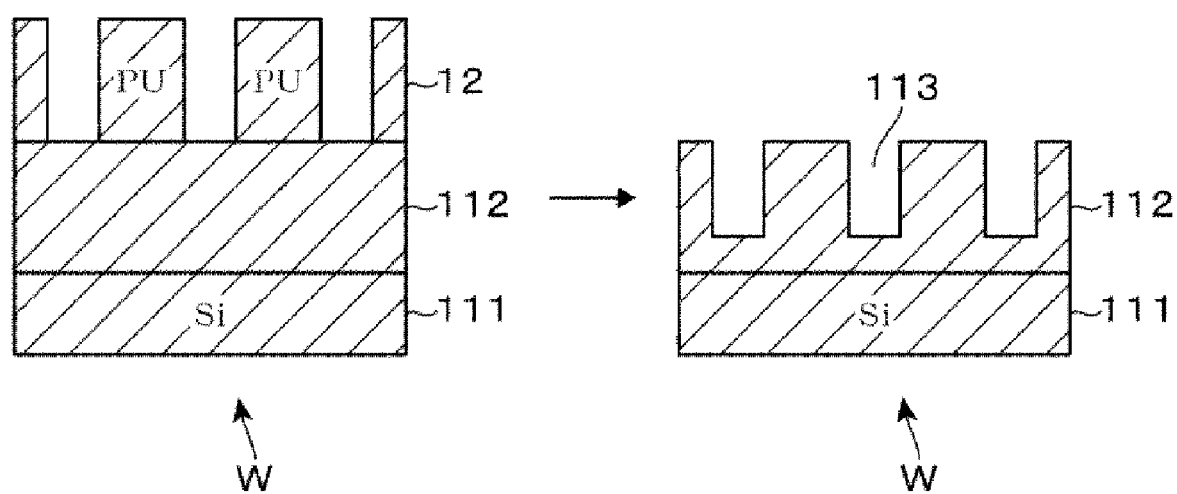
FIG. 22 is an explanatory diagram showing some of the processes of a method for manufacturing a semiconductor device in the comparative example.

FIG. 22 shows a comparative example in relation to the state of the wafer W when the etching processing is performed using the polyurea film 12 as a mask without substituting the polyurea film 12 with the polyimide film 18 after the etching of the polyurea film 12 shown in FIG. 21A. Since the polyurea film 12 has a lower etching resistance than the polyimide film 18, the polyurea film 12 dissipates before the opening 113 reaches the Si layer 111. That is, when the etching processing is required such that the opening 113 reaches the Si layer 111 without the substitution by the polyimide film 18, it is necessary to stack, on the polyurea film 12, a mask of a material different from the polyurea film 12. In other words, according to the method of the second embodiment of the present disclosure, there is no need to form such a mask. More specifically, in the process of the second embodiment, it is not necessary to form a film to be a mask on the wafer W and to form a mask pattern by etching the formed film.

Therefore, according to the second embodiment, the etching of the to-be-etched film 112 can be performed easily. In addition, like the first embodiment, since a pattern is formed on the polyurea film 12 and the polyimide film 18 is formed by substituting the polyurea film 12 in the second embodiment, it is possible to micronize the wiring of a semiconductor device. The to-be-etched film 112, for example, may be formed of a porous interlayer insulating film called low-K. The interlayer insulating film is made of, for example, SiOC. However, when the interlayer insulating film is exposed to the etching gas or the plasma of the etching gas in the etching process, the interlayer insulating film is damaged and the permittivity of the film is changed. Since the substitution of the polyurea film 12 by the polyimide film 18 can be conducted without performing the etching processing, according to the method of the second embodiment, the interlayer insulating film as the to-be-etched film 112 can be prevented from being exposed to the etching gas or plasma when forming the opening 113 therein. As a result, it is possible to suppress the damage to the interlayer insulating film and the variation in the permittivity of the film.

Figure 23A:
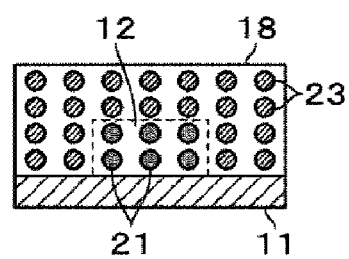
FIGS. 23A to 23C are explanatory diagrams showing the state in which a pattern is formed using film substitution.

However, as described in FIGS. 7A to 7D, the polyurea substitution by the polyimide 23 in the polyurea film 12 proceeds inward from the surface layer of the film in the film substitution process. Therefore, it is possible to stop the substitution process when only the surface layer of the polyurea film 12 is substituted by the polyimide, as shown in FIG. 23A, by appropriately setting the conditions for the substitution process such as a processing time, the temperature of the wafer W, or the like. More specifically, a film structure may be obtained such that the polyimide film 18 covers the lateral sides and upper surface of the polyurea film 12. FIG. 23A shows the state in which the heating process is stopped in the state shown in FIG. 7C and the remaining raw material monomers 22 form the urea bonds 21.

Figure 23B:
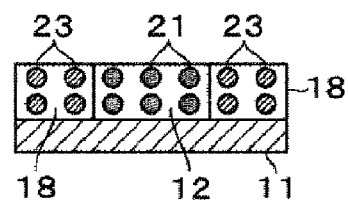
Figure 23C:
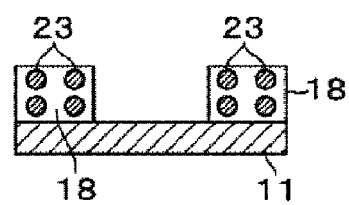

After the above film structure is formed, an etching process is performed to expose the polyurea film 12 to the surface of the wafer W as shown in FIG. 23B. Thereafter, the polyurea film 12 is removed by depolymerization, and the wafer W is heated at a temperature at which the polyimide film 18 remains in the wafer W without decomposition. As a result, the polyimide film 18 having a fine pattern may be formed as shown in FIG. 23C, and then the ion implantation or the etching processing described above may be performed using the polyimide film 18 as a mask. The present disclosure is not limited to the above-described embodiments. The examples shown in the embodiments may be appropriately modified or combined with each other.

[Evaluation Tests]

Hereinafter, evaluation tests performed in relation to the present disclosure will be described.

Evaluation Test 1

A polyurea film was formed on the surface of the substrate. Subsequently, as described in the embodiments of the present disclosure, a film substitution process was performed by heating the substrate while supplying a film substitution gas made of PMDA to the substrate. In the film substitution process, the heating temperature of the substrate was 250 degrees C. and the heating time was 30 minutes. After the film substitution process, the substrate was annealed at 350 degrees C. for 5 minutes in order to remove the remaining polyurea. Infrared absorption spectra of the surface of the substrate were obtained by means of infrared spectroscopy at the time after the formation of the polyurea film and before the film substitution process, at the time after the film substitution process and before the annealing process, and at the time after the annealing process, respectively.

Figure 24:
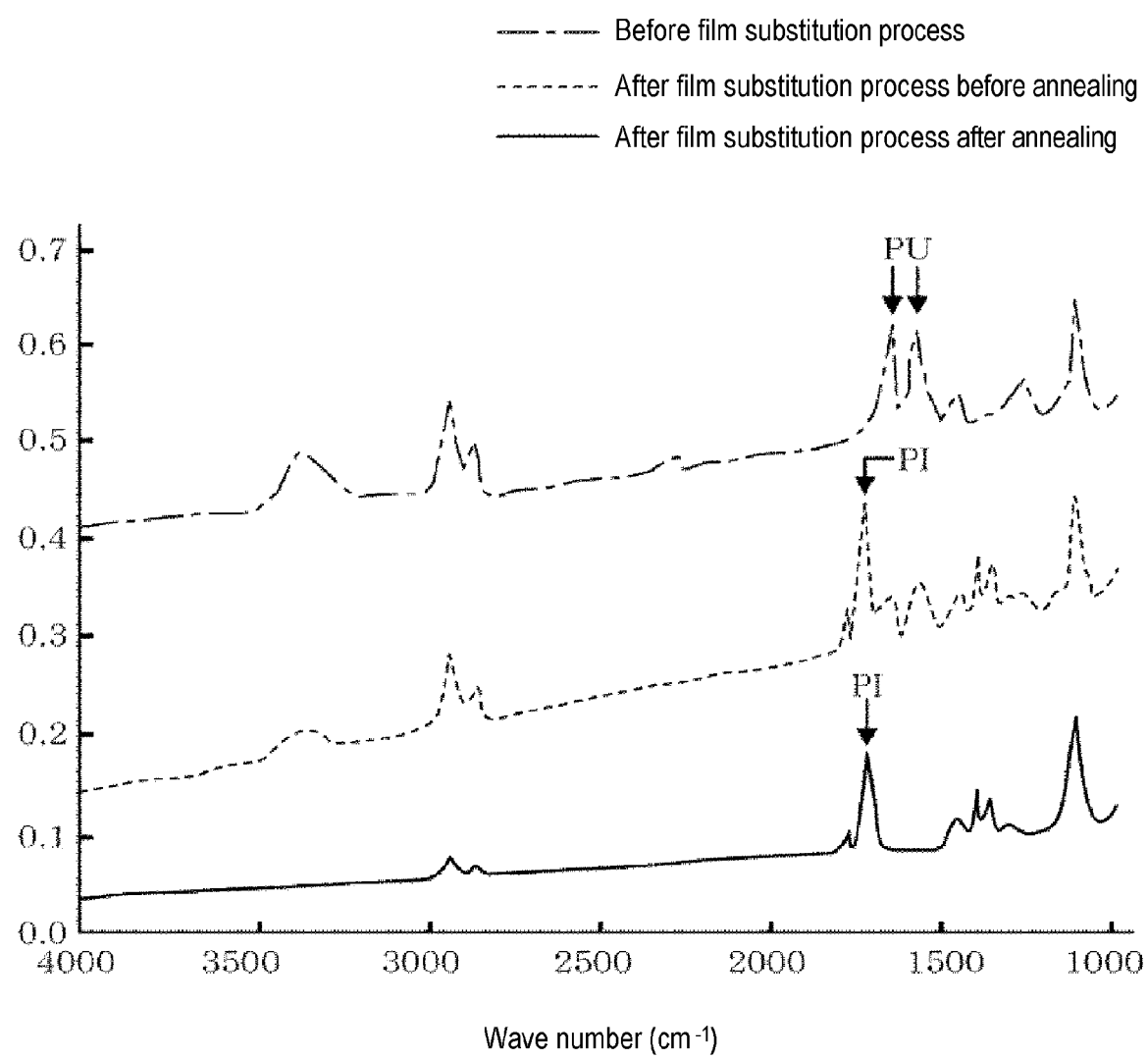
FIG. 24 is a graph showing results of evaluation tests.

The graph of FIG. 24 shows the results of Evaluation Test 1, wherein the waveforms of the spectra, which are obtained after the formation of the polyurea film and before the film substitution process, after the film substitution process and before the annealing process, and after the annealing process, are denoted by an alternating long and short dash line, a dotted line, and a solid line, respectively. The waveform of the alternating long and short dash line shows peaks (denoted as PU) indicating the presence of polyurea in the range of wave number of 1500 $cm^{-1}$ to 1700 $cm^{-1}$. The waveforms of the dotted line and the solid line show peaks (denoted as PI) indicating the presence of polyimide in the range of wave number of 1700 $cm^{-1}$ to 1800 $cm^{-1}$ instead of the peak indicating the presence of polyurea. Therefore, it was confirmed from the results of Evaluation Test 1 that the polyurea film can be substituted by the polyimide film according to the method described in the embodiments of the present disclosure.

Evaluation Test 2

A polyurea film was formed on the surface of the substrate, and then a film substitution process was performed by supplying a film substitution gas including PMDA to the substrate. Thereafter, the substrate was annealed at 350 degrees C. for 5 minutes. The film substitution process was performed for 15 minutes at different heating temperatures for the respective substrates. Evaluation Tests 2-1, 2-2, 2-3, 2-4, and 2-5 were carried out at heating temperatures of 230 degrees C., 240 degrees C., 250 degrees C., 260 degrees C., and 270 degrees C., respectively. Infrared absorption spectra on the surfaces of the substrates in Evaluation Tests 2-1 to 2-5 were obtained at the time after the film substitution process and before the annealing process and at the time after the annealing process, respectively. In addition, the thickness of the film on the surface of the substrate was obtained each time. A comparative test was performed in the same manner as Evaluation Tests 2-1 to 2-5, except that the film substitution process was not executed. Then, the thickness of the film on the surface of the substrate was obtained at the time before the annealing process and at the time after the annealing process, respectively.

Figure 25:
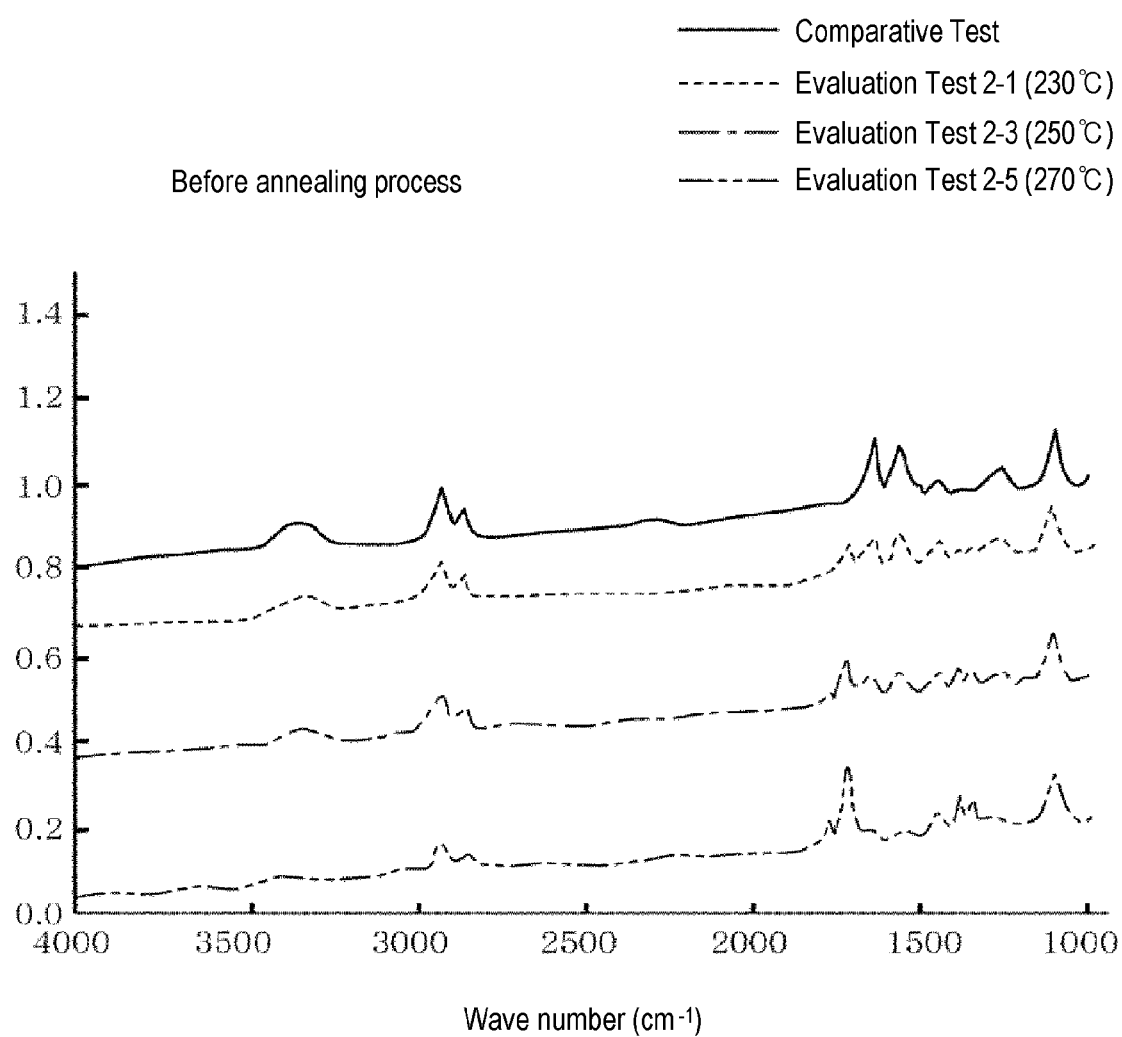
FIG. 25 is a graph showing results of evaluation tests.
Figure 26:
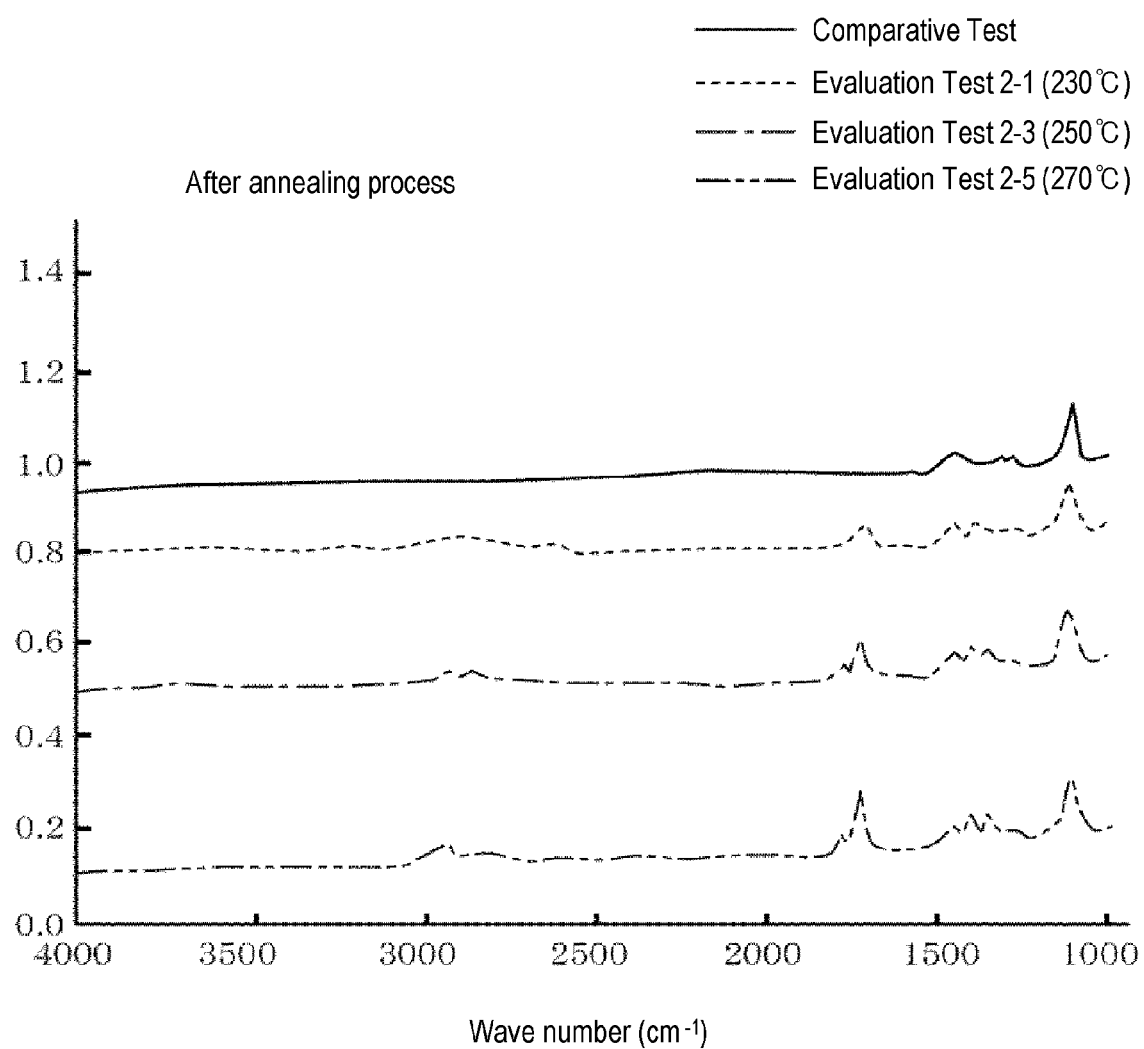
FIG. 26 is a graph showing results of evaluation tests.

Graphs in FIGS. 25 and 26 and Table 1 below show the results of Evaluation Test 2. In the graphs of FIGS. 25 and 26, the spectra, which are obtained from the substrates of the comparative test, Evaluation Test 2-1, Evaluation Test 2-3, and Evaluation Test 2-5, are denoted by a solid line, a dotted line, an alternating long and short dash line, and an alternating long and two short dashes line, respectively, wherein FIG. 25 shows the spectra obtained from the substrate before the annealing process and FIG. 26 shows the spectra obtained from the substrate after the annealing process. For the convenience of illustration, the waveforms of the spectra in Evaluation Tests 2-2 and 2-4 are omitted.

Referring to the spectral waveforms prior to the annealing process shown in FIG. 25, the waveform of the comparative test shows a relatively high peak indicating the presence of polyurea in the range of wave number of 1500 $cm^{-1}$ to 1700 $cm^{-1}$. This peak can be found in the waveforms of Evaluation Tests 2-1 to 2-4 as well, which become smaller in the order of Evaluation Tests 2-1, 2-2, 2-3, and 2-4. That is, when the temperature of the film substitution process becomes higher, the peak becomes smaller, and the no peak was observed in the waveform of Evaluation Test 2-5. Further, the waveform of the comparative test does not show any peak indicating the presence of polyimide in the range of wave number of 1700 $cm^{-1}$ to 1800 $cm^{-1}$, while Evaluation Tests 2-1 to 2-5 show the peaks, wherein the peak becomes higher as the temperature of the film substitution process becomes smaller.

The waveform of the spectrum after the annealing process in FIG. 26 does not show any peak indicating the presence of polyimide in the range of wave number of 1700 $cm^{-1}$ to 1800 $cm^{-1}$, while Evaluation Tests 2-1 to 2-5 show peaks, wherein the higher the temperature of the film substitution process is, the higher the peak is. Therefore, it can be seen from the spectra that the substitution of the polyurea by the polyimide can be conducted by setting the temperature of the substitution process in the range of 230 degrees C. to 270 degrees C. and that the film substitution can proceed as the temperature is increased in this range. In addition, it can be seen that the remaining polyurea can be removed, after the film substitution process, by heating the same to 350 degrees C. or more. Furthermore, as shown in Table 1, the results show that the thickness of the polyurea film 12 (the film thickness before the annealing process) was maintained substantially the same in the respective substrates of the Evaluation Tests 2-1 to 2-5, but that the higher the temperature of the substitution process is, the greater the thickness of the polyimide film after the annealing process is. As described above, the results of the test in the spectra match the results of the change in the film thickness.

TABLE 1

|  | Film Thickness before Annealing Process | Film Thickness after Annealing Process |
|---|---|---|
| Comparative Test (without film substitution) | 360 nm | 0 nm |
| Evaluation Test 2-1 | 340 nm | 30 nm |
| Evaluation Test 2-2 | 340 nm | 50 nm |
| Evaluation Test 2-3 | 330 nm | 80 nm |
| Evaluation Test 2-4 | 310 nm | 110 nm |
| Evaluation Test 2-5 | 280 nm | 170 nm |

Evaluation Test 3

Figure 27A:
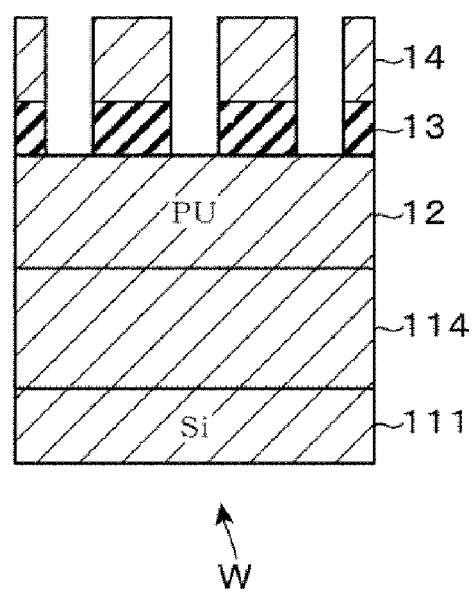
FIGS. 27A to 27C are explanatory diagrams showing a process in an evaluation test.
Figure 27B:
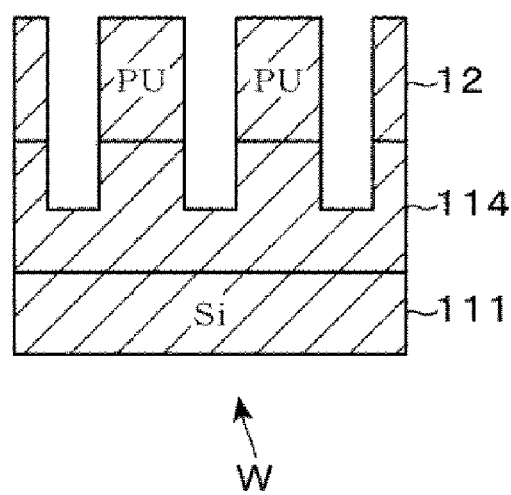

For Evaluation Test 3, a resist pattern was formed on the substrate in which an Si layer 111, a to-be-etched film 114 as an interlayer insulating film, a polyurea film 12, an inorganic film 13 as an anti-reflection film mainly formed of Si, and a resist film 14 are sequentially stacked from bottom to top, and the inorganic film 13 was etched using the resist film 14 as a mask to thus form a mask pattern (FIG. 27A). Then, the polyurea film 12 was etched using the inorganic film 13 as a mask to thus form a mask pattern, and the resist film 14 on the inorganic film 13 was removed. Thereafter, the to-be-etched film 114 was etched using the inorganic film 13 as a mask to thus form a pattern, and the inorganic film 13 was then removed (FIG. 27B).

Figure 27C:
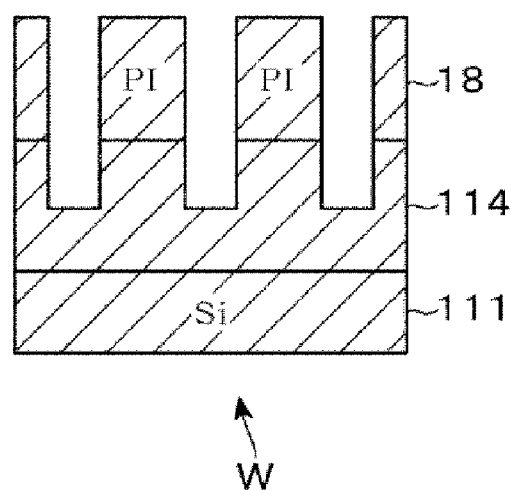

Subsequently, a film substitution process was performed by heating the substrate at 260 degrees C. for 60 minutes while supplying a film substitution gas containing the PMDA to the substrate (FIG. 27C). Thereafter, an annealing process was performed so as to heat the substrate at 350 degrees C. for 5 minutes to thus remove the remaining polyurea. Infrared absorption spectrum of the surface of the substrate was obtained at the time after the film substitution process and before the annealing process and at the time after the annealing process, respectively. In addition, as Comparative Test 4-1, the same processes as those in Evaluation Test 4 were conducted until the to-be-etched film 114 was etched and an infrared absorption spectrum was obtained after the etching processing. Further, as Comparative Test 4-2, the same processes as those in Evaluation Test 4 were performed, except that the film substitution process was not executed, and then infrared absorption spectra of the surface of the substrate were obtained after the annealing process.

In the graph of FIG. 28, the waveform of a dotted line represents the spectrum obtained after the film substitution process in Evaluation Test 3, the waveform of an alternating long and short dash line represents the spectrum obtained after the annealing process in Evaluation Test 4, the waveform of a solid line represents the spectrum obtained in Comparative Test 3-1, and the waveform of an alternating long and double-short-dash line represents the spectrum obtained in Comparative Test 3-2, respectively. The waveform of the spectrum in Comparative Test 3-1 shows a peak indicating the presence of polyurea in the range of wave number of 1500 cm$^{-1}$ to 1700 cm$^{-1}$ but does not show any peak indicating the presence of polyimide in the range of wave number of 1700 cm$^{-1}$ to 1800 cm$^{-1}$. Neither a peak indicating the presence of polyurea nor a peak indicating the presence of polyimide are shown in the waveform of Comparative Test 3-2. The waveform before the annealing process in Evaluation Test 3 shows a slight peak indicating the presence of polyurea and shows a peak indicating the presence of polyimide. The waveform after the annealing process in Evaluation Test 3 does not show a peak indicating the presence of polyurea but shows a peak indicating the presence of polyimide. Accordingly, like the results of Evaluation Test 2, it can be seen from Evaluation Test 3 that the film substitution process can be performed by heating the substrate at 260 degrees C. and that the polyurea can be removed by heating the substrate at 350 degrees C. after the substitution process.

Evaluation Test 4

The polyurea film 12 was formed by supplying, to the wafer W, a vapor generated by vaporizing H6XDA as amine and a vapor generated by vaporizing H6XDI as an isocyanate. In Evaluation Test 5, the film formation was performed using a CVD module in which the respective vapors are supplied in the horizontal direction from one end of the wafer W to the other end thereof. The H6XDA was heated to 85 degrees C. and the amount of vaporization was 0.3 g/min. The H6XDI was heated to 110 degrees C. and the amount of vaporization was 0.1 g/min. The vapors were supplied to the wafer W for 300 seconds, and the pressure in the vacuum container was 0.2 Torr (26.67 Pa). In addition, the temperature of the wafer W during the supply of the vapors varied for each process, and was set to 80 degrees C., 70 degrees C., or 60 degrees C. The thickness of the polyurea film 12, which is formed in the respective portions inside the surface of the wafer W processed with the film formation, was measured.

When the temperature of the wafer W was 80 degrees C., the average value of the film thickness was 54 nm, the maximum value thereof was 65 nm, the minimum value thereof was 40 nm, and 1σ was 13%. When the temperature of the wafer W was 70 degrees C., the average value of the film thickness was 144 nm, the maximum value thereof was 188 nm, the minimum value thereof was 92 nm, and 1σ was 20%. When the temperature of the wafer W was 60 degrees C., the average value of the film thickness was 297 nm, the maximum value thereof was 468 nm, the minimum value thereof was 142 nm, and 1σ was 34%. As described above, it was confirmed from Evaluation Test 5 that it is possible to form the polyurea film 12 by supplying the vapor of the amine and the vapor of the isocyanate to the wafer W.

Evaluation Test 5

A first chemical liquid was prepared by adding H6XDA (amine) to acetone, and a second chemical liquid was prepared by adding H6XDI (isocyanate) to acetone. Then, immediately after mixing the chemical liquids with each other to prepare a mixed liquid, a substrate rotating at 1500 rpm was spin-coated with the mixed liquid. Thereafter, the weight and thickness of a film formed thereon were measured. The concentrations of the H6XDA and the H6XDI in the first chemical liquid and the second chemical liquid varied for each coating process, and the mixed solution was prepared by mixing the first and second chemical liquids at the same concentration.

As a result of the test, when the concentration was 20 wt %, the weight was 7.7 mg and the film thickness was 3.6 μm.

When the concentration was 5 wt %, the weight was 1.7 mg and the film thickness was 0.7 μm. When the concentration was 2.5 wt %, the weight was 1.1 mg and the film thickness was 0.5 μm. When the concentration was 2.0 wt %, the weight was 0.8 mg and the film thickness was 0.3 μm. In addition, when the concentration is 1.0 wt %, the weight was 0.3 mg and the film thickness was 0.1 μm. It was confirmed from the results of Evaluation Test 5 that it is possible to form the polyurea film by means of spin-coating.

According to the present disclosure, a substrate having a first film, which is formed of a polymer having urea bonds and has a pattern formed thereon, is heated to thus depolymerize the polymer. With the depolymerization, a reaction gas, which reacts with a polymerization raw material constituting the polymer to thus generate a product, is supplied to the substrate so as to form a second film of a material different from that of the first film by means of substitution of the first film. Accordingly, it is possible to micronize a pattern formed on the second film, and as a result thereof, it is possible to micronize of the wiring of a semiconductor device manufactured using the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for manufacturing a semiconductor device by processing a substrate, the method comprising:
    forming a first film of a polymer having urea bonds by supplying a polymerization raw material to a surface of the substrate;
    subsequently, forming a pattern by etching the first film; and
    subsequently, forming a second film of a material different from the polymer of the first film by performing a substitution processing to the first film by supplying a reaction gas, which reacts with the polymerization raw material to generate a product, to the substrate while heating the substrate to depolymerize the polymer,
    wherein the forming a second film is performed by heating the substrate to 200 degrees C. to 300 degrees C.

2. The method of claim 1, further comprising etching or ion-implanting a lower layer provided under the second film using the second film as a mask.

3. The method of claim 1, wherein the second film is formed of polyimide.

4. The method of claim 1, wherein the forming a first film further comprises supplying a liquid of isocyanate and a liquid of amine to the substrate and performing a polymerization reaction of the isocyanate and the amine on the surface of the heated substrate.

5. The method of claim 4, wherein the supplying a liquid of isocyanate and a liquid of amine to the substrate comprises:
    supplying, to a first flow path, the liquid of isocyanate from a first supply source in which the liquid of isocyanate is stored;
    supplying, to a second flow path, the liquid of amine from a second supply source in which the liquid of amine is stored; and
    supplying the liquid of isocyanate and the liquid of amine to a joining flow path, which is formed by joining of the downstream side of the first flow path and the downstream side of the second flow path, mixing the liquids, and discharging the mixed liquids from a nozzle to the substrate.

6. The method of claim 1, wherein the forming a first film comprises supplying a vapor of isocyanate and a vapor of amine to the substrate and heating the substrate to polymerize the isocyanate and the amine.

* * * * *